US012777289B2

(12) United States Patent
Zhu et al.

(10) Patent No.: US 12,777,289 B2
(45) Date of Patent: Oct. 27, 2026

(54) ACOUSTIC OUTPUT DEVICE WITH TWO RESONANCE PEAKS WITHIN AN AUDIBLE RANGE OF HUMAN EARS

(71) Applicant: SHENZHEN SHOKZ CO., LTD., Shenzhen (CN)

(72) Inventors: Guangyuan Zhu, Shenzhen (CN); Lei Zhang, Shenzhen (CN); Xin Qi, Shenzhen (CN); Qingyi Wang, Beijing (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 750 days.

(21) Appl. No.: 18/298,396

(22) Filed: Apr. 11, 2023

(65) Prior Publication Data

US 2023/0328458 A1 Oct. 12, 2023

Related U.S. Application Data

(63) Continuation of application No. PCT/CN2022/085561, filed on Apr. 7, 2022.

(51) Int. Cl.
*H04R 17/10* (2006.01)
*H04R 1/28* (2006.01)
*H10N 30/20* (2023.01)

(52) U.S. Cl.
CPC ........... *H04R 17/10* (2013.01); *H04R 1/2811* (2013.01); *H10N 30/2042* (2023.02)

(58) Field of Classification Search
None
See application file for complete search history.

(56) References Cited

U.S. PATENT DOCUMENTS

| | | | | |
|---|---|---|---|---|
| 4,654,554 | A | 3/1987 | Kishi | |
| 9,306,148 | B2 * | 4/2016 | Onishi | H10N 30/88 |
| 11,432,084 | B2 * | 8/2022 | Bergs | H04R 23/02 |
| 11,800,293 | B2 * | 10/2023 | Ye | H04R 17/00 |
| 2007/0177747 | A1 | 8/2007 | Onishi et al. | |

(Continued)

FOREIGN PATENT DOCUMENTS

| | | | |
|---|---|---|---|
| CN | 201227623 | Y | 4/2009 |
| CN | 102833657 | A | 12/2012 |

(Continued)

OTHER PUBLICATIONS

The Extended European Search Report in European Application No. 22877659.7 mailed on Nov. 21, 2024, 9 pages.

(Continued)

*Primary Examiner* — William J Klimowicz
(74) *Attorney, Agent, or Firm* — METIS IP LLC

(57) ABSTRACT

The embodiment of the present disclosure provides an acoustic output device, which includes a first vibration element, a second vibration element, and a piezoelectric element. The first vibration element is physically connected to a first position of the piezoelectric element, and the second vibration element is connected to a second position of the piezoelectric element at least through an elastic element. The piezoelectric element drives the first vibration element and the second vibration element to vibrate in response to an electric signal, and the vibration generates two resonance peaks within the audible range of the human ear.

19 Claims, 10 Drawing Sheets

(56) References Cited

U.S. PATENT DOCUMENTS

| | | | | |
|---|---|---|---|---|
| 2010/0038998 | A1 | 2/2010 | Onishi et al. | |
| 2013/0049876 | A1 | 2/2013 | Onishi et al. | |
| 2013/0242702 | A1 | 9/2013 | Onishi et al. | |
| 2018/0124530 | A1 | 5/2018 | Bergs et al. | |
| 2018/0213331 | A1* | 7/2018 | Rucker | H04R 25/554 |
| 2018/0279061 | A1* | 9/2018 | Walravens | H04R 25/606 |
| 2021/0176574 | A1 | 6/2021 | Bergs et al. | |
| 2021/0227329 | A1 | 7/2021 | Ogata et al. | |
| 2021/0373666 | A1 | 12/2021 | Ting et al. | |
| 2021/0392439 | A1* | 12/2021 | Ye | H04R 17/00 |
| 2022/0150650 | A1* | 5/2022 | Rucker | H04R 17/00 |
| 2022/0240029 | A1* | 7/2022 | Liao | H04R 25/606 |
| 2023/0179925 | A1* | 6/2023 | Fu | G10K 11/178<br>381/150 |
| 2023/0300521 | A1* | 9/2023 | Zhu | H04R 1/288 |
| 2023/0328455 | A1* | 10/2023 | Zhu | H04R 17/00 |
| 2023/0358602 | A1* | 11/2023 | Yuan | G01H 13/00 |

FOREIGN PATENT DOCUMENTS

| | | | |
|---|---|---|---|
| CN | 114025293 | A | 2/2022 |
| JP | S5557176 | A | 4/1980 |
| JP | 2000233157 | A | 8/2000 |
| JP | 2021197737 | A | 12/2021 |
| WO | 0154450 | A2 | 7/2001 |

OTHER PUBLICATIONS

First Office Action in Indian Application No. 202317026881 mailed on Nov. 14, 2025, 6 pages.

* cited by examiner

700

800

1600

ACOUSTIC OUTPUT DEVICE WITH TWO RESONANCE PEAKS WITHIN AN AUDIBLE RANGE OF HUMAN EARS

CROSS-REFERENCE TO RELATED APPLICATION

This application is a continuation of International Patent Application No. PCT/CN2022/085561, filed on Apr. 7, 2022, the contents of which are entirely incorporated herein by reference.

TECHNICAL FIELD

The present disclosure relates to the field of acoustic technology, and in particular to an acoustic output device.

BACKGROUND

A piezoelectric acoustic output device utilizes an inverse piezoelectric effect of a piezoelectric material to generate a vibration and radiate a sound wave outward. Compared to a traditional electric speaker, the piezoelectric acoustic output device has advantages of high electromechanical conversion efficiency, low energy consumption, small size, and high integration, etc. Under the current trend of miniaturization and integration of devices, the piezoelectric acoustic output device has an extremely broad prospect and future. However, the piezoelectric acoustic output device has problems such as poor low-frequency response and a large number of vibration modes in an audible range of the human ear (e.g., 20 Hz-20 kHz), resulting in their inability to form a relatively flat frequency response curve in the audible range, which causes a poor sound quality.

Therefore, it is desired to provide an acoustic output device to improve the low-frequency response of the piezoelectric acoustic output device, and at the same time form a relatively flat frequency response curve in the audible range, thereby improving the sound quality of the acoustic output device.

SUMMARY

One embodiment of the present disclosure may provide an acoustic output device. The acoustic output device may include a first vibration element; a second vibration element; and a piezoelectric element. The first vibration element may be physically connected to a first position of the piezoelectric element, and the second vibration element may be connected to a second position of the piezoelectric element at least through an elastic element, wherein the piezoelectric element drives the first vibration element and the second vibration element to vibrate in response to an electrical signal, and the vibration produces two resonance peaks within an audible range of human ears.

In some embodiments, the resonance of the second vibration element and the elastic element produces a first resonance peak with the lower frequency among the two resonance peaks, and the resonance of the piezoelectric element and the first vibration element produces a second resonance peak with the higher frequency among the two resonance peaks.

In some embodiments, the frequency of the first resonance peak is in a range of 50 Hz-2000 Hz, and the frequency of the second resonance peak is in a range of 1 kHz-10 kHz.

In some embodiments, the second vibration element and the elastic element are connected to the second position of the piezoelectric element through the connection element.

In some embodiments, the piezoelectric element includes a beam-like structure, and the first position is located at the middle of a length extension direction of the beam-like structure.

In some embodiments, the second position is located at an end of the length extension direction of the beam-like structure.

In some embodiments, in the length extension direction of the beam-like structure, a size of the second vibration element is not smaller than the size of the piezoelectric element.

In some embodiments, the vibration is transmitted to a user through the second vibration element in a bone conduction manner.

In some embodiments, the acoustic output device may further comprise a second piezoelectric element, the second piezoelectric element may receive the vibration of the second vibration element, and the second piezoelectric element resonates to generate a third resonance peak whose frequency is higher than the frequency of any one of the two resonance peaks.

In some embodiments, the frequency of the third resonance peak is in a range of 10 kHz-40 kHz.

In some embodiments, the acoustic output device further includes a fourth vibration element. The fourth vibration element may be connected to a third position of the second piezoelectric element through at least a third elastic element, wherein the third elastic element and the fourth vibration element resonate to generate a fifth resonance peak whose frequency is lower than the frequency of the third resonance peak, and a ratio value of an absolute value of a difference between the frequencies corresponding to the second resonance peak and the fifth resonance peak to the frequency corresponding to the second resonance peak is in a range of 0-4.

In some embodiments, both the piezoelectric element and the second piezoelectric element include the beam-like structure, and the length of the beam-like structure of the second piezoelectric element is shorter than the length of the beam-like structure of the piezoelectric element.

In some embodiments, a ratio value of the length of the beam-like structure of the second piezoelectric element to the length of the beam-like structure of the piezoelectric element is in a range of 0.1-1.

In some embodiments, an absolute value of a phase difference between excitation signals of the piezoelectric element and the second piezoelectric element is in a range of 45°-135°.

In some embodiments, the acoustic output device further includes a third piezoelectric element, wherein the third piezoelectric element vibrates and transmits the vibration to the second piezoelectric element, and the third piezoelectric element resonates to generate a fourth resonance peak whose frequency is lower than the frequency of the third resonance peak.

In some embodiments, the acoustic output device further includes a third vibration element, wherein the third vibration element is connected with the third piezoelectric element at least through a second elastic element, and the vibration of the third piezoelectric element is transmitted to the second piezoelectric element through the third vibration element.

In some embodiments, the piezoelectric element includes a beam-like structure, and the first vibration element comprises two vibration sub-elements, and the two vibration sub-elements are respectively connected to two ends of a length extension direction of the piezoelectric element.

In some embodiments, the two vibration sub-elements have the same mass, and the two first positions where the two vibration sub-elements are connected to the piezoelectric element are symmetrical with respect to a center of the piezoelectric element.

In some embodiments, the length of the piezoelectric element is in a range of 3 mm-30 mm.

In some embodiments, the piezoelectric element comprises two piezoelectric sheets and a substrate, and the two piezoelectric sheets are attached to opposite sides of the substrate respectively, the substrate vibrates in response to an extension and contraction of the two piezoelectric sheets along the length extension direction.

Some of additional features of the present disclosure may be set forth in the description that follows. Through the study on the following descriptions and the corresponding drawings, or the understanding on the operations and productions of the embodiments, a part of the additional features of the present disclosure may become apparent to those skilled in the art. The features of the present disclosure may be implemented and obtained by practicing or using various aspects of the methods, means and combinations set forth in the following detailed examples.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
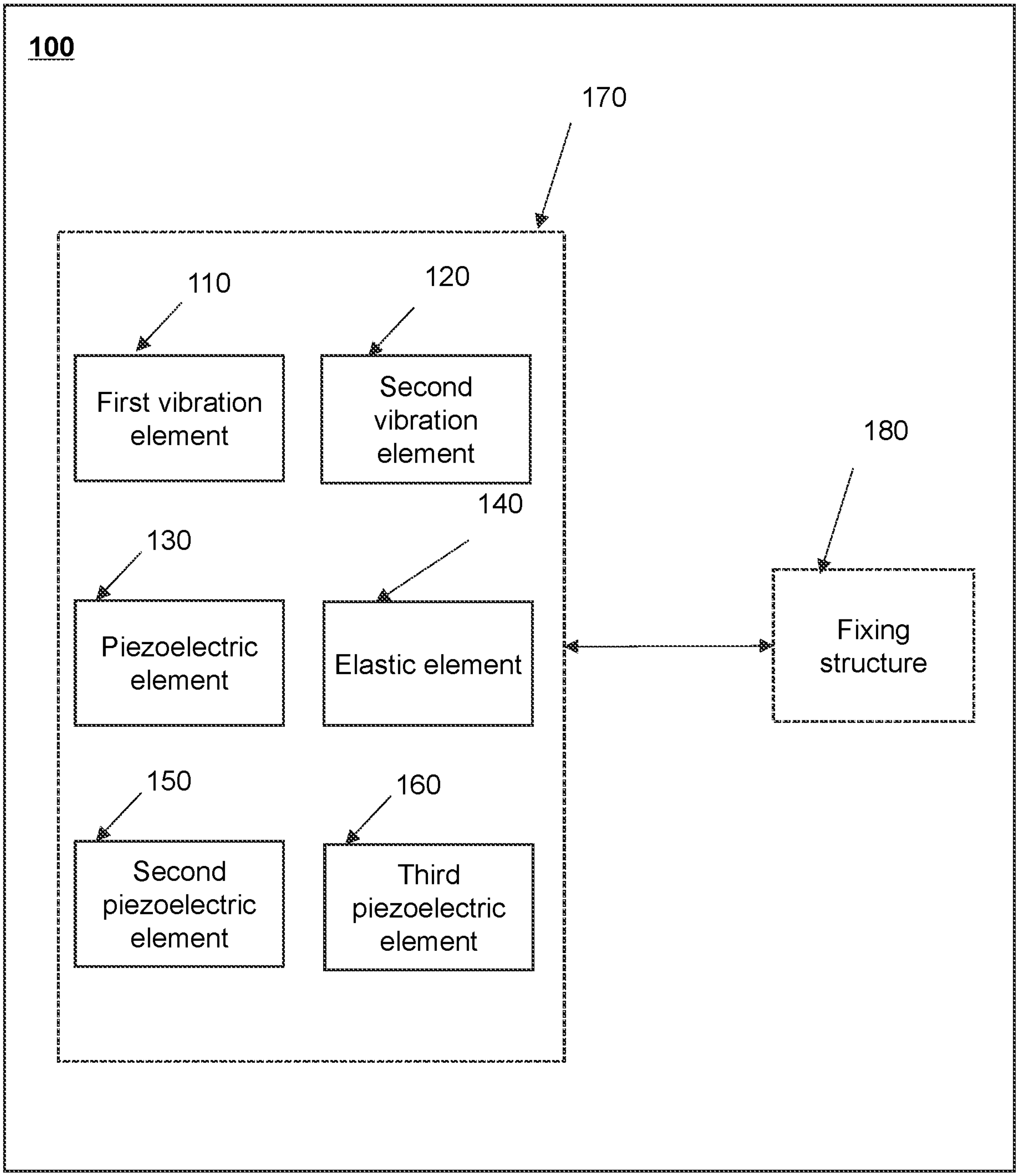
FIG. 1 is a structural block diagram illustrating an exemplary acoustic output device according to some embodiments of the present disclosure.

In order to more clearly illustrate the technical solutions related to the embodiments of the present disclosure, a brief introduction of the drawings referred to the description of the embodiments is provided below. Obviously, the drawings described below are only some examples or embodiments of the present disclosure. Those skilled in the art, without further creative efforts, may apply the present disclosure to other similar scenarios according to these drawings. It should be understood that these exemplary embodiments are given only for the purpose of enabling those skilled in the art to better understand and implement the present disclosure, but not to limit the scope of the present disclosure in any way. Unless obviously obtained from the context or the context illustrates otherwise, the same numeral in the drawings refers to the same structure or operation.

It will be understood that the term "system," "engine," "unit," "module," and/or "block" used herein are one method to distinguish different components, elements, parts, sections, or assembly of different levels in ascending order. However, the terms may be displaced by another expression if they achieve the same purpose.

The terminology used herein is for the purposes of describing particular examples and embodiments only and is not intended to be limiting. As used herein, the singular forms "a," "an," and "the" may be intended to include the plural forms as well, unless the context clearly indicates otherwise. In general, the terms "comprise," "comprises," and/or "comprising," "include," "includes," and/or "including," merely prompt to include steps and elements that have been clearly identified, and these steps and elements do not constitute an exclusive listing. The methods or devices may also include other steps or elements. The term "based on" is "based at least in part on." The term "one embodiment" may indicate "at least one embodiment"; the term "another example" means "at least one other embodiment".

In the description of the present disclosure, it should be understood that the terms "first," "second," "third," "fourth," etc. are for the purpose of illustration only, and should not be understood as counts indicating or implying a relative importance or implying the technical feature indicated. Thus, a feature defined with "first," "second," "third" and "fourth" may explicitly or implicitly include at least one of such features. In the description of the present disclosure, "plurality" means at least two, such as two, three, etc., unless otherwise specifically defined.

In the present disclosure, unless otherwise clearly specified and limited, terms such as "connection" and "fixation" should be interpreted in a broad sense. For example, the term "connection" may refer to a fixed connection, or a detachable connection, or an integration; the "connection" may be a mechanically or electrically connection; the "connection" may be a direct connection, or an indirect connection through an intermediary, or an internal communication between two elements or an interaction relationship between two elements, unless otherwise clearly defined. For those skilled in the art, the specific meanings of the above terms in the present disclosure may be understood according to specific situations.

The acoustic output device provided in the embodiments of the present disclosure may utilize the inverse piezoelectric effect to generate a vibration through a piezoelectric element to output sound. Generally, the piezoelectric element may adopt two working modes, namely d33 and d31. In the d33 working mode, a vibration direction (also called a displacement output direction) of the piezoelectric element is the same as an electrical direction (also called a polarization direction) of the piezoelectric element. The resonance frequency of the piezoelectric element is relatively high, an output amplitude is relatively small, and a low-frequency response is poor. In the d31 working mode, the vibration direction of the piezoelectric element is perpendicular to the electrical direction of the piezoelectric element. In the d31 working mode, although a sufficiently low-frequency peak may be provided by increasing a length of the piezoelectric element, and the output amplitude is also significantly increased, but in this case, the piezoelectric element may have many vibration modes in the audible range (for example, 20 Hz-20 kHz), which is manifested by more peaks and valleys in the frequency response curve, so the sound quality of the acoustic output device (or a piezoelectric speaker) is still poor.

To solve the problems of poor low-frequency response and many modes in the audible range of the piezoelectric speaker, the acoustic output device provided by the embodiments of the present disclosure may include a first vibration element, a second vibration element, and a piezoelectric element. The first vibration element is physically connected to a first position of the piezoelectric element, and the second vibration element is at least connected to a second position of the piezoelectric element through an elastic element. The piezoelectric element may drive the first vibration element and the second vibration element to vibrate in response to an electrical signal. The vibration may generate two resonance peaks (e.g., a first resonance peak and a second resonance peak) within the audible range of the human ear.

According to some embodiments of the present disclosure, by using the resonance of the second vibration element and the elastic element to generate a first resonance peak with a lower frequency (for example, 50 Hz-2000 Hz) of the two resonance peaks, the low-frequency response of the piezoelectric element may be improved. In addition, since the resonance between the piezoelectric element and the first vibration element may generate a second resonance peak with a higher frequency (e.g., 1 kHz-10 kHz) of the two resonance peaks, when the sound signal is output through the vibration by the second vibration element (e.g., the second vibration element fits a user's face to deliver a bone conduction sound to the user, or the second vibration element pushes air to generate an air conduction sound radiated towards the user's ear), the frequency response curve between the first resonance peak and the second resonance peak may be flatter, thereby improving the sound quality of the acoustic output device. In some embodiments, when the sound signal is output through the vibration by the first vibration element (e.g., the first vibration element fits the user's face to deliver the bone conduction sound to the user, or the first vibration element pushes the air to generate the air conduction sound radiated towards the user's ear), a sensitivity of the acoustic output device in middle and high-frequency bands (e.g., 500 Hz-10 kHz) may be improved, thereby facilitating an application of the acoustic output device in special scenarios.

The acoustic output device provided by the embodiments of the present disclosure may be described in detail below with reference to the accompanying drawings.

FIG. 1 is a structural block diagram illustrating an exemplary acoustic output device according to some embodiments of the present disclosure. In some embodiments, an acoustic output device 100 may be a bone conduction acoustic output device, an air conduction acoustic output device, or an acoustic output device combined with bone conduction and air conduction. In some embodiments, the acoustic output device 100 may include a speaker, an earphone, glasses, a hearing aid, an augmented reality (AR) device, a virtual reality (VR) device, etc., or other devices with an audio playback function (such as a mobile phone, a computer, etc.). In some embodiments, the acoustic output device 100 may be an open acoustic output device. As shown in FIG. 1, the acoustic output device 100 may include a first vibration element 110, a second vibration element 120, a piezoelectric element 130, and an elastic element 140.

Both the first vibration element 110 and the second vibration element 120 may be mass blocks with a certain mass. In some embodiments, the first vibration element 110 and/or the second vibration element 120 may include a vibration plate, a diaphragm, etc., so that the acoustic output device 100 outputs a vibration through the first vibration element 110 and/or the second vibration element 120. In some embodiments, the material of the mass block may include but not be limited to metal (e.g., copper, iron, magnesium, aluminum, tungsten, etc.), alloy (aluminum alloy, titanium alloy, tungsten alloy, etc.), polymer material (e.g., polytetrafluoroethylene (PTFE), silicone rubber, etc.) and other materials. In some embodiments, the material of the first vibration element 110 and the material of the second vibration element 120 may be the same or different. In some embodiments, the mass of the first vibration element 110 and the mass of the second vibration element 120 may be the same or different. In some embodiments, the mass of the first vibration element 110 or the second vibration element 120 may be less than 10 g. In some embodiments, the mass of the first vibration element 110 or the second vibration element 120 may be less than 8 g. In some embodiments, the mass of the first vibration element 110 or the second vibration element 120 may be less than 6 g. In some embodiments, the mass of the first vibration element 110 or the second vibration element 120 may be less than 5 g.

Figure 2:
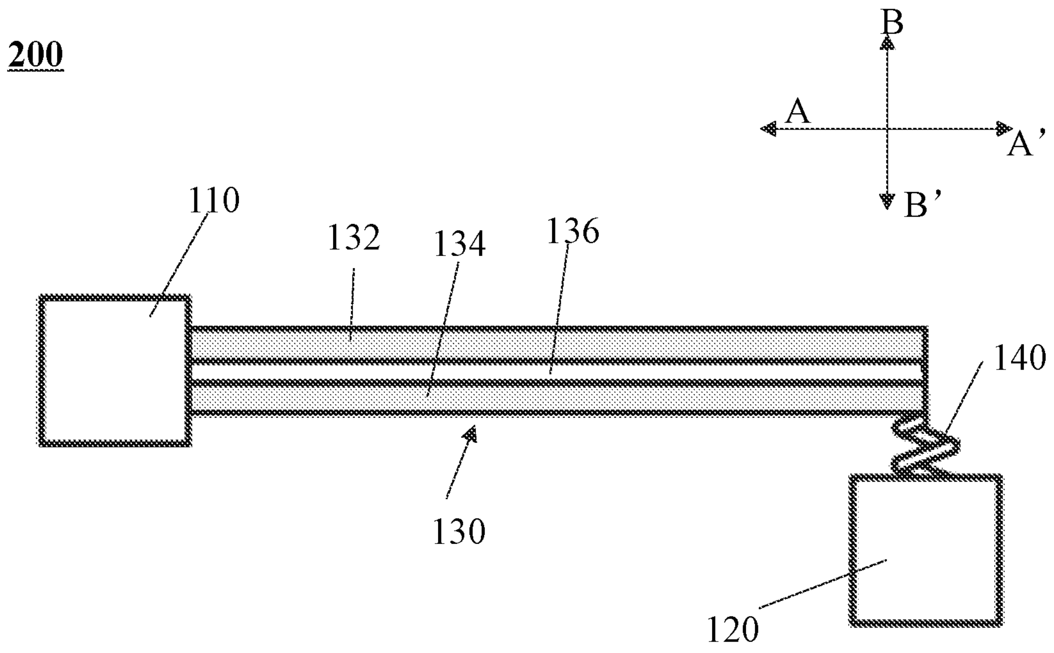
FIG. 2 is a schematic structural diagram illustrating an exemplary acoustic output device according to some embodiments of the present disclosure.
Figure 7:
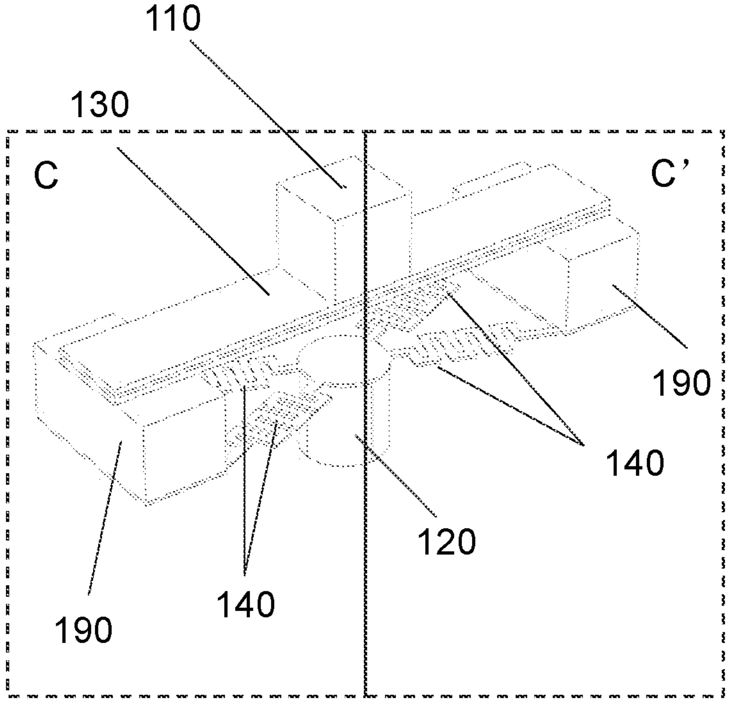
FIG. 7 is a schematic structural diagram illustrating an acoustic output device according to some embodiments of the present disclosure.

The first vibration element 110 may be physically connected (e.g., bond, clamped, screwed, welded, etc.) to a first position of the piezoelectric element 130, and the second vibration element 120 may be connected to a second position of the piezoelectric element 130 at least through the elastic element 140. In some embodiments, the first position may be the same as or different from the second position. For example, when the piezoelectric element 130 has a beam-like structure, both the first position and the second position may be located at an end of the length extension direction of the beam-like structure of the piezoelectric element 130. As another example, as shown in FIG. 2, the first position and the second position may be respectively located at two ends of the length extension direction of the beam-like structure of the piezoelectric element 130. As another example, as shown in FIG. 7, the first position may be located at the middle of the piezoelectric element 130, and the second position may be located at any end of the length extension direction of the beam-like structure of the piezoelectric element 130. In the present disclosure, the length extension direction of the beam-like structure of the piezoelectric element 130 refers to a direction in which a feature size of the beam-like structure in the extension direction is more than one time a feature size of the beam-like structure in any other direction. In some embodiments, the beam-like structure may include a linear beam-like structure, a curved beam-like structure, etc. In the present disclosure, the linear beam structure is used as an example for illustration, which is not intended to limit the scope of the present disclosure. In some embodiments, the elastic element 140 may be directly connected to the second position of the piezoelectric element 130. In some embodiments, the acoustic output device 100 may include a connector (not shown). The second vibration element 120 and the elastic element 140 may be connected to the second position of the piezoelectric element 130 through the connector. For example, as shown in FIG. 7, the second vibration element 120 and the elastic element 140 may be connected to the end of the piezoelectric element 130 (i.e., the second position) through a connector 190.

The first vibration element 110 and the second vibration element 120 may respectively vibrate in response to the vibration of the piezoelectric element 130. Specifically, the piezoelectric element 130 may directly transmit the vibration to the first vibration element 110, and the vibration of the piezoelectric element 130 may be transmitted to the second vibration element 120 through the elastic element 140. In the embodiment of the present disclosure, the first vibration element 110 directly connected to the piezoelectric element 130 may be called a mass end, and the second vibration element 120 connected to the piezoelectric element 130 through the elastic element 140 may be called an elastic mass end.

In some embodiments, the material of the elastic element 140 may be any material capable of transmitting vibration. For example, the material of the elastic element 140 may be silicone, foam, plastic, rubber, metal, etc., or any combination thereof. In some embodiments, the elastic element 140 may be an element with good elasticity (i.e., easy to undergo elastic deformation). For example, the elastic element 140 may include a spring (e.g., an air spring, a mechanical spring, an electromagnetic spring, etc.), a vibration plate, an elastic sheet, a substrate, etc., or any combination thereof. In some embodiments, a count of the elastic element 140 may be one or more. For example, as shown in FIG. 2, the second vibration element 120 may be connected to the piezoelectric element 130 through the elastic element 140. As another example, as shown in FIG. 7, the second vibration element 120 may be connected to the piezoelectric element 130 through four elastic elements 140. In some embodiments, the shape of the elastic element 140 may be a ring, a rod-like structure, etc. In some embodiments, the elastic elements 140 may be distributed asymmetrically with an axis passing through the center of the piezoelectric element 130.

Figure 16:
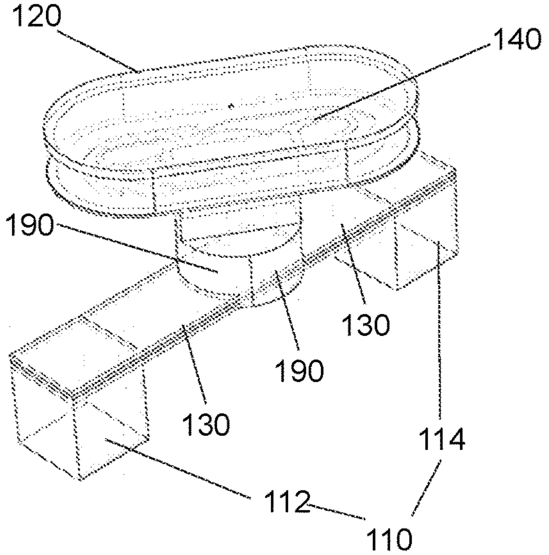
FIG. 16 is a schematic structural diagram illustrating an exemplary acoustic output device according to some embodiments of the present disclosure.

The piezoelectric element 130 may be an electrical energy conversion device capable of converting electrical energy into mechanical energy using the inverse piezoelectric effect. In some embodiments, the piezoelectric element 130 may be composed of piezoelectric ceramics, piezoelectric quartz, piezoelectric crystals, piezoelectric polymers, and other materials with the piezoelectric effect. In some embodiments, the piezoelectric element 130 may be in the shape of a sheet, a ring, a prism, a cube, a column, a ball, etc., or any combination thereof, or other irregular shapes. In some embodiments, the piezoelectric element 130 may include a beam-like structure (as shown in FIG. 2, FIG. 7, FIG. 16, etc.). As an example, the piezoelectric element 130 may include two piezoelectric sheets and a substrate, and the two piezoelectric sheets are respectively attached to opposite sides of the substrate. The substrate may vibrate (e.g., vibrate in a direction perpendicular to a surface of the substrate) in response to the extension and contraction of the two piezoelectric sheets along the length extension direction of the beam-like structure. More descriptions of the beam-like structure may be found in FIG. 2 and the related descriptions.

Figure 17:
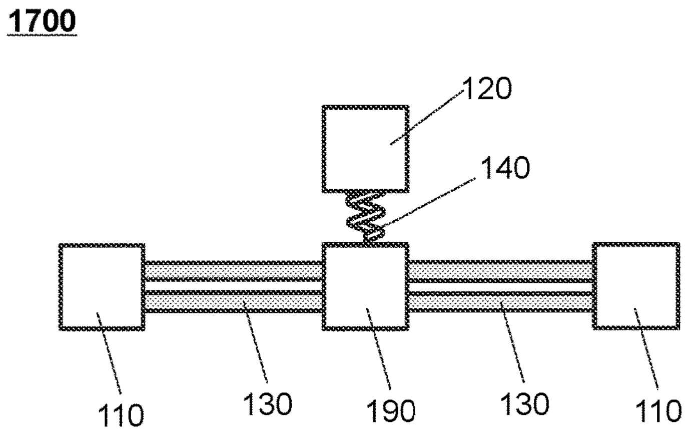
FIG. 17 is a schematic structural diagram illustrating an exemplary acoustic output device according to some embodiments of the present disclosure.

In some embodiments, when the piezoelectric element 130 includes the beam-like structure, the first position and the second position may be respectively located at two ends of the piezoelectric element 130 (as shown in FIG. 2). In some embodiments, when the piezoelectric element 130 includes the beam-like structure, the first position may be located at the middle of the length extension direction of the beam-like structure. The second position may be located at an end of the length extension direction of the beam-like structure (as shown in FIG. 7). In some embodiments, when the piezoelectric element 130 includes the beam-like structure, the first vibration element 110 may include two vibration sub-elements, wherein the two vibration sub-elements may be respectively connected to the two ends (i.e., the first position) of the length extension direction of the piezoelectric element 130 (as shown in FIG. 17). The second position may be located at the middle of the length extension direction of the piezoelectric element 130.

The piezoelectric element 130 may be deformed under an action of a driving voltage (or an excitation signal), thereby generating the vibration. The vibration may drive the first vibration element 110 and the second vibration element 120 to vibrate, thereby generating two resonance peaks within the audible range (e.g., 20 Hz-20 kHz) of the human ear. Specifically, the resonance of the second vibration element 120 and the elastic element 140 may generate the first resonance peak (e.g., the resonance peaks shown in the dotted circle X in FIG. 4) with the lower frequency (e.g., 20 Hz-2000 Hz) of the two resonance peaks, the resonance of the piezoelectric element 130 and the first vibration element 110 may generate the second resonance peak (e.g., the resonance peaks shown in the dotted circle Y in FIG. 4) with the higher frequency (e.g., 1 kHz-10 kHz) of the two resonance peaks. The frequency (also referred to as the second resonance frequency) corresponding to the second resonance peak may be higher than the frequency (also referred to as the first resonance frequency) corresponding to the first resonance peak.

In some embodiments, a frequency range of the first resonance frequency corresponding to the first resonance peak may be adjusted by adjusting the mass of the second vibration element 120 and/or an elastic coefficient of the elastic element 140. In some embodiments, the frequency range of the first resonance frequency may be 20 Hz-2000 Hz. In some embodiments, the frequency range of the first resonance frequency may be 50 Hz-1500 Hz. In some embodiments, the frequency range of the first resonance frequency may be 100 Hz-1000 Hz. In some embodiments, the frequency range of the first resonance frequency may be 150 Hz-500 Hz. In some embodiments, the frequency range of the first resonance frequency may be 150 Hz-200 Hz.

In some embodiments, the frequency range of the second resonance frequency corresponding to the second resonance peak may be adjusted by adjusting performance parameters of the piezoelectric element 130. In some embodiments, the performance parameters of the piezoelectric element 130 may include geometric parameters, material parameters, and the like. Exemplary geometric parameters may include thickness, length, and the like. Exemplary material parameters may include elastic modulus, density, and the like. In some embodiments, the second resonance frequency may be a natural frequency of the piezoelectric element 130. In some embodiments, the frequency range of the second resonance frequency may be 1 kHz-10 kHz. In some embodiments, the frequency range of the second resonance frequency may be 1 kHz-9 kHz. In some embodiments, the frequency range of the second resonance frequency may be 1 kHz-8 kHz. In some embodiments, the frequency range of the second resonance frequency may be 1 kHz-7 kHz. In some embodiments, the frequency range of the second resonance frequency may be 1 kHz-6 kHz. In some embodiments, the frequency range of the second resonance frequency may be 2 kHz-5 kHz. In some embodiments, the frequency range of the second resonance frequency may be 3 kHz-4 kHz.

In some embodiments, a damping may be added to one or more components in the acoustic output device 100, so as to make the frequency response curve of the output of the acoustic output device 100 flatter. For example, the elastic element 140 may be made of a material with a greater damping effect (e.g., silicone, rubber, foam, etc.). As another example, a damping material may be coated on the piezoelectric element 130. As further another example, the damping material or an electromagnetic damping may be coated on the first vibration element 110 and/or the second vibration element 120.

In some embodiments, the vibration of the piezoelectric element 130 (or the acoustic output device 100) may be transmitted to a user by bone conduction through the first vibration element 110 and/or the second vibration element 120. Exemplarily, the second vibration element 120 may directly contact the skin of the user's head, and the vibration of the piezoelectric element 130 is transmitted to bones and/or muscles of the user's face through the second vibration element 120, and finally transmitted to the user's ear. As another example, the second vibration element 120 may not be in a direct contact with the human body, the vibration of the piezoelectric element 130 may be transmitted to a shell of the acoustic output device through the second vibration element 120, then transmitted to the user's facial bones and/or muscles through the shell, and finally transmitted to the user's ear. In some embodiments, the vibration of the piezoelectric element 130 may further be transmitted to the user through the first vibration element 110 and/or the second vibration element 120 by air conduction. Exemplarily, the second vibration element 120 may directly drive the air around it to vibrate, so as to be transmitted to the user's ear through the air. As another example, the second vibration element 120 may be further connected to a diaphragm, and the vibration of the second vibration element 120 may be transmitted to the diaphragm, and then the diaphragm may drive the air to vibrate, so that the vibration may be transmitted to the user's ear through the air.

In some embodiments, the acoustic output device 100 may further include a second piezoelectric element 150. In some embodiments, both the piezoelectric element 130 (also referred to as a first piezoelectric element 130) and the second piezoelectric element 150 may include the beam-like structure. The length (i.e., the dimension along the length extension direction of the beam-like structure, also referred to as the second length) of the beam-like structure of the second piezoelectric element 150 may be shorter than the length (also referred to as the first length) of the beam-like structure of the first piezoelectric element 130. In some embodiments, the second piezoelectric element 150 may be directly connected to the second vibration element 120. For example, the second piezoelectric element 150 may be directly attached to the second vibration element 120. The second piezoelectric element 150 may receive the vibration of the second vibration element 120. The resonance of the second piezoelectric element 150 may generate a third resonance peak with a frequency higher than the first resonance peak and the second resonance peak. In some embodiments, a frequency range of a third resonance frequency corresponding to the third resonance peak may be adjusted by adjusting performance parameters (e.g., a geometric parameter, a material parameter, etc.) of the second piezoelectric element 150. In some embodiments, the frequency range of the third resonance frequency may be 10 kHz-40 kHz. For more descriptions of the second piezoelectric element 150, please refer to FIG. 10, which are not repeated here.

In some embodiments, the acoustic output device 100 may further include a third piezoelectric element 160. The third piezoelectric element 160 may generate the vibration in response to the electrical signal and transmit the vibration to the second piezoelectric element 150. In some embodiments, the vibration of the third piezoelectric element 160 may be transmitted to the second piezoelectric element 150 through a third vibration element. In some embodiments, the third vibration element may be connected to the third piezoelectric element 160 at least through a second elastic element. The resonance of the third piezoelectric element 160 may generate a fourth resonance peak with a lower frequency than that of the third resonance peak. For more descriptions of the third piezoelectric element 160, please refer to FIG. 14, which are not repeated here.

In some embodiments, the acoustic output device 100 may further include a shell structure 170. The shell structure 170 may be configured to carry other components of the acoustic output device 100 (e.g., the first vibration element 110, the second vibration element 120, the piezoelectric element 130, the elastic element 140, etc.). In some embodiments, the shell structure 170 may be a closed or semi-closed structure with a hollow interior, and other components of the acoustic output device 100 are located within or on the shell structure. In some embodiments, a shape of the shell structure may be a regular or irregular three-dimensional structure such as a cuboid, a cylinder, a truncated cone, etc. When the user wears the acoustic output device 100, the shell structure may be located near the user's ear. For example, the shell structure may be located on a peripheral side (e.g., the front side or a rear side) of an auricle of the user. As another example, the shell structure may be located at the ear of the user without blocking or covering an ear canal of the user. In some embodiments, the acoustic output device 100 may be a bone conduction earphone, and at least one side of the shell structure may be in contact with the user's skin. An acoustic driver component (e.g., a combination of the piezoelectric element 130, the first vibration element 110, the elastic element 140, and the second vibration element 120) in the bone conduction earphone converts an audio signal into a mechanical vibration, and the mechanical vibration is transmitted through the shell structure and the user's bones to the user's auditory nerves. In some embodiments, the acoustic output device 100 may be an air conduction earphone, and at least one side of the shell structure may or may not be in contact with the user's skin. A side wall of the shell structure includes at least one sound guide hole, and the acoustic driver component in the air conduction earphone converts the audio signal into an air conduction sound, and the air conduction sound may radiate toward the user's ear through the sound guide hole.

In some embodiments, the acoustic output device 100 may include a fixing structure 180. The fixing structure 180 may be configured to fix the acoustic output device 100 near the user's ear. In some embodiments, the fixing structure 180 may be physically connected to the shell structure 170 of the acoustic output device 100 (e.g., bond, clamped, screwed, etc.). In some embodiments, the shell structure 170 of the acoustic output device 100 may be part of the fixing structure 180. In some embodiments, the fixing structure 180 may include an ear hook, a rear hanger, an elastic band, a temple, etc., so that the acoustic output device 100 may be better fixed near the user's ears and prevent the device from falling during use. For example, the fixing structure 180 may be an ear hook configured to be worn around the ear area. In some embodiments, the ear hook may be a continuous hook, and may be elastically stretched to be worn on the user's ear, and at the same time, the ear hook may further apply pressure on the user's auricle, so that the acoustic output device 100 may be firmly fixed on a specific position of the user's ear or head. In some embodiments, the ear hook may be a discontinuous band. For example, the ear hook may include a rigid portion and a flexible portion. The rigid portion may be made of a rigid material (e.g., plastic or metal), and the rigid portion may be fixed to the shell structure 170 of the acoustic output device 100 through the physical connection (e.g., clamping, threaded connection, etc.). The flexible portion may be made of an elastic material (e.g., a cloth, a composite material, a neoprene, etc.). As another example, the fixing structure 180 may be a neck strap configured to be worn around a neck/shoulder area. As another example, the fixing structure 180 may be a leg of glasses, which, as a part of the glasses, is erected on the user's ear.

It should be noted that the above description about FIG. 1 is provided for the purpose of illustration only, and is not intended to limit the scope of the present disclosure. For persons having ordinary skills in the art, a plurality of variations and modifications may be made under the teachings of the present disclosure. For example, in some embodiments, the acoustic output device 100 may further include one or more components (e.g., a signal transceiver, an interaction module, a battery, etc.). In some embodiments, the one or more components in the acoustic output device 100 may be replaced by other elements that can perform similar functions. For example, the acoustic output device 100 may not include the fixing structure 180, and the shell structure 170 or a portion thereof may have a shape suitable for the human ear (such as circular, elliptical, polygonal (regular or irregular), U-shaped, V-shaped, semicircular) so that the shell structure may be hung near the user's ear. Those variations and modifications do not depart from the scope of the present disclosure.

Figure 3:
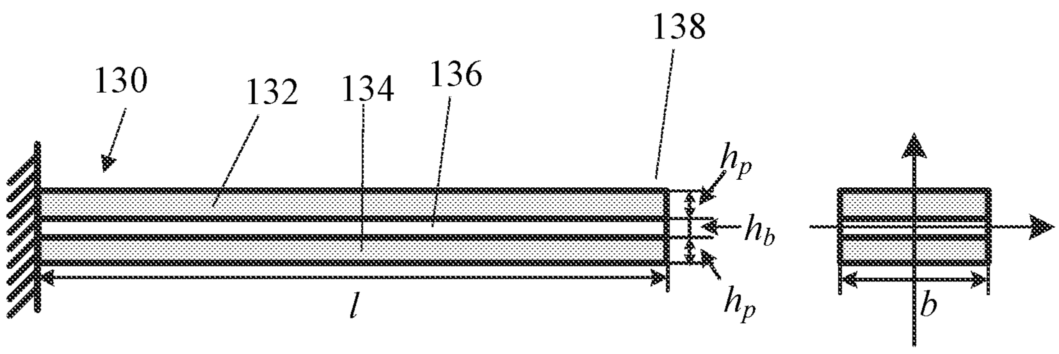
FIG. 3 is a piezoelectric cantilever beam model according to some embodiments of the present disclosure.
Figure 4:
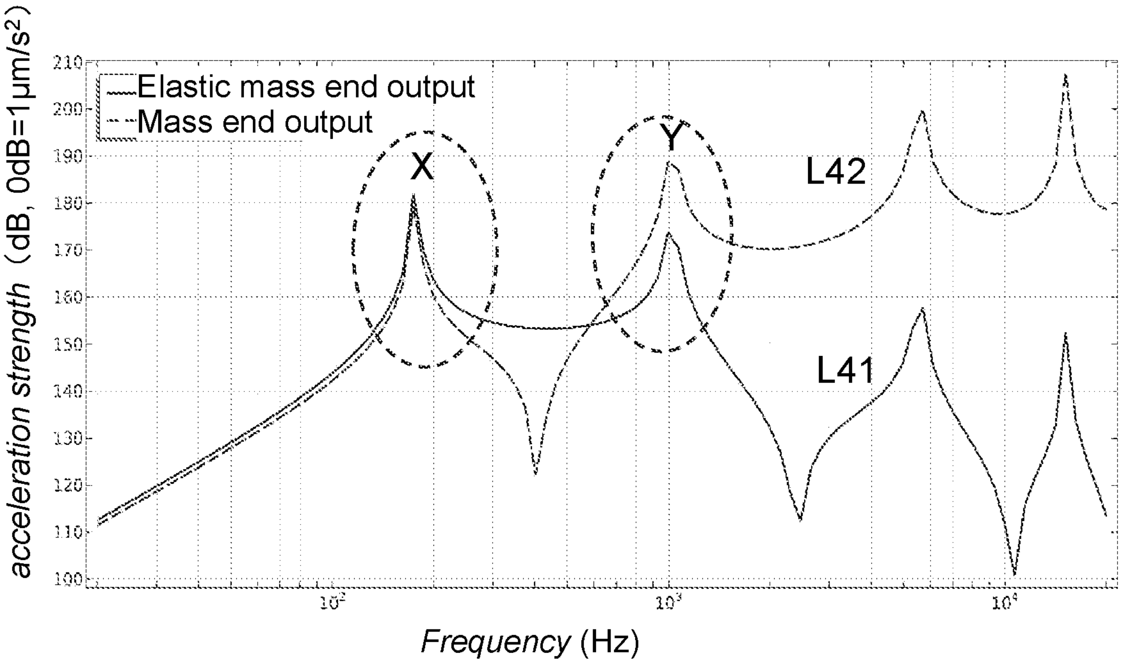
FIG. 4 is a frequency response curve diagram illustrating an output of an elastic mass end and a mass end of an exemplary acoustic output device according to some embodiments of the present disclosure.

FIG. 2 is a schematic structural diagram illustrating an exemplary acoustic output device according to some embodiments of the present disclosure. FIG. 3 is a piezoelectric cantilever beam model according to some embodiments of the present disclosure. As shown in FIG. 2, the acoustic output device 200 may include the first vibration element 110, the second vibration element 120, the piezoelectric element 130, and the elastic element 140. The piezoelectric element 130 may include a beam-like structure. The first vibration element 110 is connected to one end (i.e., a first position) of the piezoelectric element 130, and the second vibration element 120 is connected to the other end (i.e., a second position) of the piezoelectric element 130 through the elastic element 140. The piezoelectric element 130 may drive the first vibration element 110 and the second vibration element 120 to vibrate. The vibration generates two resonance peaks within an audible range of a human ear (as shown in FIG. 4). What needs to be known is that when the piezoelectric element 130 vibrates, the ends of the beam-like structure along the length extension direction have a relatively large vibration amplitude, which has a relatively high sensitivity. Therefore, the first position and the second position are set at the ends of the length extension direction of the beam-like structure to improve a sensitivity of the frequency response of the acoustic output device 200. In some embodiments, the acoustic output device 200 may further include a fixed structure (not shown), which may be configured to fix the acoustic output device 200 near the user's ear, so that the piezoelectric element 130 and the first vibration element 110 (and/or the second vibration element 120) form a cantilever beam-like structure. In the present disclosure, a structure in which one end of the length extension direction of a piezoelectric element with a beam-like structure is connected to one vibration element, and the other end is connected to another vibration element through an elastic element may be referred to as a single-beam structure for short.

In some embodiments, the piezoelectric element 130 may include two piezoelectric sheets (i.e., a piezoelectric sheet 132 and a piezoelectric sheet 134) and a substrate 136. The substrate 136 may be configured as a carrier for carrying components and an element that deforms in response to vibration. In some embodiments, a material of the substrate 136 may include one or a combination of metal (such as copper-clad foil, steel, etc.), phenolic resin, cross-linked polystyrene, etc. In some embodiments, a shape of the substrate 136 may be determined according to the shape of the piezoelectric element 130. For example, the piezoelectric element 130 includes a beam-like structure, and the substrate 136 may be correspondingly arranged in a strip shape. As another example, if the piezoelectric element 130 is a piezoelectric film, the substrate 136 may be correspondingly arranged in a plate shape or a sheet shape.

The piezoelectric sheet 132 and the piezoelectric sheet 134 may be components that provide the piezoelectric effect and/or the inverse piezoelectric effect. In some embodiments, the piezoelectric sheets may cover one or more surfaces of the substrate 136, and deform under an action of a driving voltage to drive the substrate 136 to deform, so that the piezoelectric element 130 may output the vibration. For example, along a thickness direction (as shown by the arrow BB' in the figure) of the piezoelectric element 130, the piezoelectric sheet 132 and the piezoelectric sheet 134 are respectively attached to opposite sides of the substrate 136, and the substrate 136 may generate the vibration according to the extension and contraction of the piezoelectric sheet 132 and the piezoelectric sheet 134 along the length extension direction (as shown by the arrow AA' in the figure) of the piezoelectric element 130. Specifically, when electricity is applied along the thickness direction BB' of the piezoelectric element 130, the piezoelectric sheet on one side of the substrate 136 may contract along its length extension direction, and the piezoelectric sheet on the other side of the substrate 136 may extend along its length extension direction, thereby driving the substrate 136 to bend and vibrate along the direction perpendicular to the surface of the substrate 136 (i.e., the thickness direction BB').

In some embodiments, the material of the piezoelectric sheets 132 and/or 134 may include piezoelectric ceramic, piezoelectric quartz, piezoelectric crystal, piezoelectric polymer, etc., or any combination thereof. Exemplary piezoelectric crystals may include crystal, sphalerite, Borborite, tourmaline, zincite, GaAs, barium titanate and its derivative structure crystal, $KH_2PO_4$, $NaKC_4H_4O_6\cdot 4H2O$ (Roch salt), etc. Exemplary piezoelectric ceramic materials may include barium titanate (BT), lead zirconate titanate (PZT), lead barium lithium niobate (PBLN), modified lead titanate (PT), aluminum nitride (AlN), zinc oxide (ZnO), etc., or any combination thereof. Exemplary piezoelectric polymer materials may include polyvinylidene fluoride (PVDF), etc.

The resonance of an elastic mass end formed by the second vibration element 120 and the elastic element 140 may generate the first resonance peak with a lower frequency, and the resonance between the piezoelectric element 130 and the first vibration element 110 may generate the second resonance peak with a higher frequency. For example, the first resonance frequency $f_0$ corresponding to the first resonance peak may range from 50 Hz to 2000 Hz, and the second resonance frequency $f_1$ corresponding to the second resonance peak may range from 1 kHz to 10 kHz. In some embodiments, when the vibration signal is output from a mass element of the elastic mass end (that is, the second vibration element 120), a flat frequency response curve (as shown by the curve L41 in FIG. 4) is formed between the first resonance peak and the second resonance peak of the frequency response curve of the acoustic output device 200. In some embodiments, the magnitude of the first resonance frequency corresponding to the first resonance peak is affected by the mass of the second vibration element 120 and an elastic coefficient of the elastic element 140. In some embodiments, the first resonance frequency of the first resonance peak may be determined according to formula (1):

$$f_0 = \frac{1}{2\pi}\sqrt{\frac{k}{m}}, \tag{1}$$

where, $f_0$ indicates the first resonance frequency, k indicates the elastic coefficient of the elastic element 140, and m indicates the mass of the second vibration element 120.

Referring to FIG. 3, the second resonance frequency $f_1$ of the second resonance peak may be approximately determined by a first-order resonance peak of the frequency response of a free end 138 of a piezoelectric cantilever beam with the same length as the piezoelectric element 130 having the beam-like structure. For example, the second resonance frequency of the second resonance peak may be determined according to formula (2):

$$f_1 = \frac{3.516}{2\pi}\sqrt{\frac{E_bI_b + E_pI_p}{\rho_l l^4}}, \tag{2}$$

where b indicates the width of the piezoelectric element 130, $E_b$ indicates an elastic modulus of the material of the substrate 136, $I_b$ indicates a moment of inertia of the area of the substrate 136, $E_p$ indicates the elastic modulus of the material of the piezoelectric sheet 132 or 134, $I_p$ indicates the moment of inertia of the area of the piezoelectric sheet 132 or 134, $\rho_t$ indicates a density per unit length of the piezoelectric sheet 132 or 134, and l indicates the length of the piezoelectric element 130. It should be known that in the present disclosure, the piezoelectric cantilever beam refers to a structure of the single-beam structure shown in FIG. 2 when the piezoelectric element 130 is not connected with the elastic element 140 and the second vibration element 120.

The moment of inertia $I_b$ of the area of the substrate 136 satisfies:

$$I_b = \frac{bh_b^3}{12}, \tag{3}$$

where, $h_b$ indicates the thickness of the substrate 136.

The moment of inertia $I_p$ of the area of the piezoelectric sheet 132 or 134 satisfies:

$$I_p = \frac{2bh_p^3}{3} + bh_p^2h_b + \frac{bh_ph_b^2}{2}, \tag{4}$$

where, $h_p$ indicates the thickness of the piezoelectric sheet 132 or 134.

The unit length density $\rho_l$ of the piezoelectric element 130 satisfies:

$$\rho_l = bh_b\rho_b + 2\cdot bh_p\rho_b, \tag{5}$$

where, $\rho_b$ indicates the density of the substrate 136, and $\rho_p$ indicates the material density of the piezoelectric sheet 132 or 134.

Therefore, in some embodiments, the second resonance frequency $f_1$ of the acoustic output device 200 may be adjusted by designing performance parameters of the piezoelectric element 130 (e.g., a material parameter (including the elastic modulus, the density), a geometric parameter (including the thickness, the length), etc.).

Figure 5:
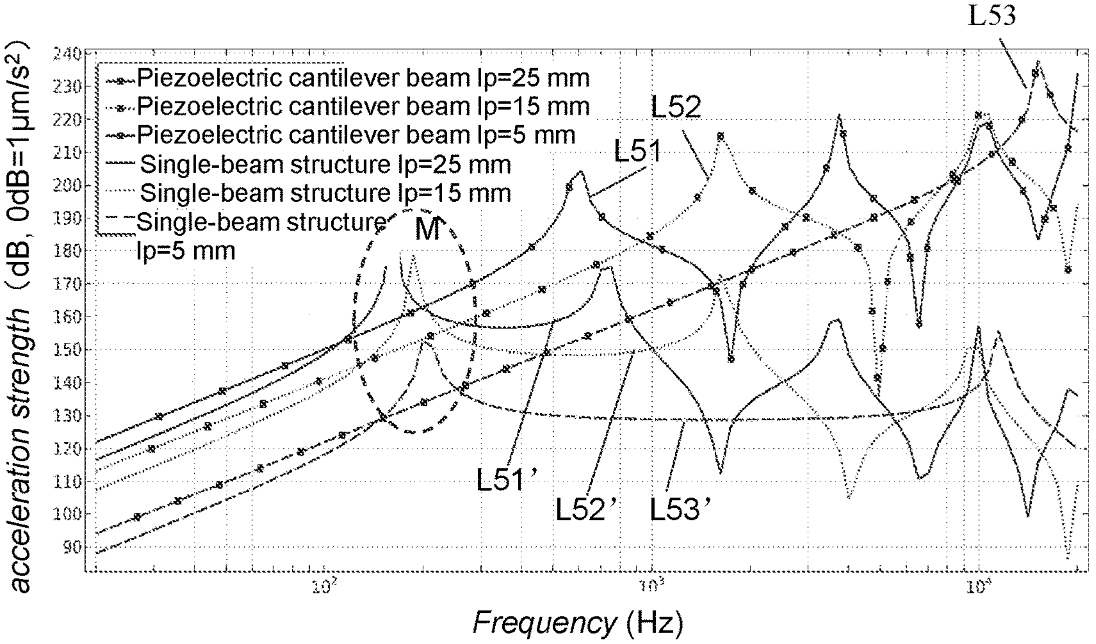
FIG. 5 is a comparison diagram illustrating frequency responses output by free ends of piezoelectric cantilever beams and frequency responses of acoustic output devices each of which includes a single-beam structure with the same beam length as the corresponding piezoelectric cantilever beam according to some embodiments of the present disclosure.

Specifically, in some embodiments, a flat curve range in the frequency response curve of the acoustic output device 200 may be adjusted by adjusting the length of the piezoelectric element 130. In some embodiments, as shown in FIG. 5, to ensure the sound quality and minimize the occurrence of high-order modes (or vibration modes) in the audible range (20 Hz~20 kHz), the beam-like structure of the piezoelectric element 130 may be as short as possible. In some embodiments, to ensure the sensitivity of the acoustic output device 200 in the low-frequency range (e.g., 100 Hz-1000 Hz), the length of the beam-like structure of the piezoelectric element 130 cannot be too short. In some embodiments, to improve the sensitivity of the acoustic output device 200 in the low-frequency range (e.g., 100

Figure 6:
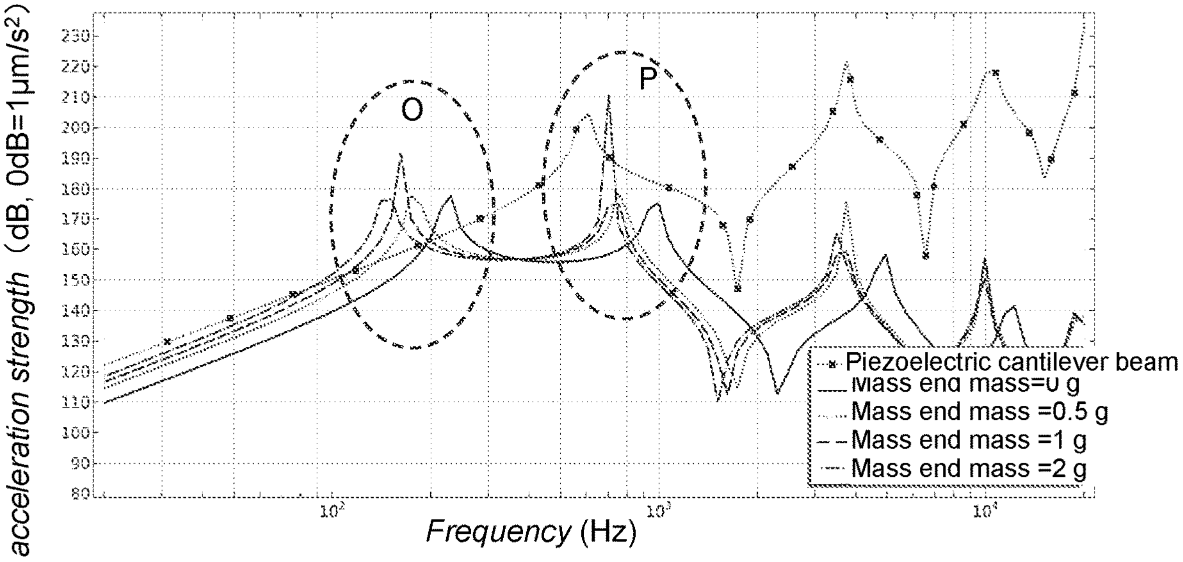
FIG. 6 illustrates frequency response curves of acoustic output devices including first vibration elements with different masses according to some embodiments of the present disclosure.

Hz-1000 Hz) and have a flat frequency response curve in the range of 100 Hz-500 Hz, the length of the piezoelectric element 130 may be between 20 mm-30 mm. In some embodiments, in order not to reduce the sensitivity of the acoustic output device 200 in the low-frequency range (e.g., 100 Hz-800 Hz), and to have a flat frequency response curve in the range of 200 Hz-2000 Hz, the length of the piezoelectric element 130 may be between 10 mm-20 mm. In some embodiments, to make the acoustic output device 200 have a flat frequency response curve in the range of 200 Hz-5 kHz, the length of the piezoelectric element 130 may be between 3 mm-10 mm. In some embodiments, a fine tuning of the resonance peak (e.g., the first resonance peak and/or the second resonance peak) may further be implemented by adjusting the mass of the mass end (i.e., the first piezoelectric element 110) (as shown in FIG. 6).

In some embodiments, specific structural parameters of the acoustic output device 200 may be designed based on an output requirement of the acoustic output device 200. Exemplarily, according to actual requirements (for example, 50 Hz), the ranges of the first resonance frequency $f_0$ and the second resonance frequency $f_1$ may be determined first. Secondly, the mass of the second vibration element 120 (e.g., a vibration plate) of the elastic mass end may be determined. Then, according to a size requirement (mainly according to a spatial size) of the acoustic output device 200, the width of the piezoelectric element 130 may be determined. Finally, the thicknesses of the substrate 136 and the piezoelectric sheets may be determined based on a production process technical ability of the piezoelectric sheet.

After determining the above parameters, the elastic coefficient of the elastic element 140 may be calculated:

$$k=(2\pi f_0)^2 m. \tag{6}$$

Then, the length of the piezoelectric element 130 may be determined according to the material parameter (e.g., the elastic modulus, the density, etc.) and the geometric parameter (e.g., the thickness, the length, etc.) of the piezoelectric element 130.

Finally, all geometric parameters of the acoustic output device 200 may be determined.

FIG. 4 is a frequency response curve diagram illustrating outputs of an elastic mass end and a mass end of an exemplary acoustic output device according to some embodiments of the present disclosure. As shown in FIG. 4, curve L41 indicates a frequency response curve of the acoustic output device 200 when a vibration signal is output from the elastic mass end. Curve L42 indicates a frequency response curve of the acoustic output device 200 when the vibration signal is output from the mass end. The first resonance peaks in the dotted circle X may be generated by the resonance of the second vibration element 120 and the elastic element 140. The second resonance peak in the dotted circle Y may be generated by the resonance of the piezoelectric element 130 and the first vibration element 110. It may be seen from FIG. 4 that the curves L41 and L42 respectively have two resonance peaks in a range of 20 Hz-2 kHz. When the vibration signal is output from the mass end (corresponding to the curve L42), the acoustic output device 200 has a higher sensitivity in middle and high-frequency bands (such as 600 Hz-5 kHz). However, there is a resonance valley between the first resonance peak and the second resonance peak, which affects the sound quality of the acoustic output device 200 in the middle and low-frequency bands (such as 200 Hz-1000 Hz). Therefore, when an application scenario of the acoustic output device 200 requires the higher sensitivity in the middle and high-frequency bands, it may be preferable to output the vibration signal through the mass end. When the vibration signal is output from the elastic mass end (corresponding to the curve L41), the acoustic output device 200 has a relatively flat frequency response curve between the first resonance peak and the second resonance peak, so that the acoustic output device 200 may have a better sound quality in the audible range.

FIG. 5 is a comparison diagram illustrating frequency responses output by free ends of piezoelectric cantilever beams and frequency responses of acoustic output devices each of which includes a single-beam structure with the same beam length as the corresponding piezoelectric cantilever beam according to some embodiments of the present disclosure. As shown in FIG. 5, curves L51, L52, and L53 indicate frequency response curves of piezoelectric cantilever beams with lengths of 25 mm, 15 mm, and 5 mm, respectively. Curves L51', L52', and L53' indicate frequency response curves of acoustic output devices having single-beam structures with beam lengths of 25 mm, 15 mm, and 5 mm, respectively. From the curves L51, L52, and L53 in FIG. 5, it can be seen that the shorter (for example, 5 mm) the piezoelectric cantilever beam is, the fewer high-order modes in the audible range (20 Hz~20 kHz) are. It can be seen from the comparison of curves L51 and L51', L52 and L52', L53 and L53' that when the length of the piezoelectric cantilever beam is the same as the length of the beam of the single-beam structure, a first-order resonance frequency of the free end of the piezoelectric cantilever beam is close to the second resonance frequency of the acoustic output device including a single-beam structure of the corresponding beam length. Therefore, to make the acoustic output device have as few high-order modes (or vibration modes) as possible within the audible range, the beam-like structure of the piezoelectric element 130 in the single-beam structure should be as short as possible. In addition, it can be seen from the curves L51', L52', and L53' that under various beam lengths (i.e., the length of the piezoelectric element 130 in the single-beam structure), the first resonance frequency of the single-beam structure (i.e., the frequency of the resonance peak generated by the resonance between the elastic element 140 and the second vibration element 120 in the structure) (the frequency corresponding to the resonance peak in dotted circle M) slightly increases due to the shortening of the beam and the decrease in mass, and forms a flat curve between the first resonance peak and the second resonance peak.

FIG. 6 illustrates frequency response curves of acoustic output devices including first vibration elements with different masses according to some embodiments of the present disclosure. As shown in FIG. 6, when the piezoelectric elements 130 have the same length, the resonance peak of the acoustic output device 200 moves to a lower frequency as the mass of the mass end (the first vibration element 110) increases. Therefore, in some embodiments, the mass of the mass end (the first vibration element 110) may be increased or decreased to move the frequency response curve of the acoustic output device 200 left and right as a whole, so as to realize a fine tuning of positions of the first resonance peak (the resonance peak in dotted circle O) and the second resonance peak (the resonance peak in dotted circle P). In some embodiments, the mass of the first vibration element 110 may be adjusted according to an actually required flat frequency response range. For example, if it is required to shift the flat frequency response range of the acoustic output device to a lower frequency, the first vibration element 110 with a greater mass may be provided. On the contrary, if it is required to shift the flat frequency response range of the acoustic output device to a higher frequency, the first vibration element 110 with a smaller mass may be provided. In some embodiments, the mass of the first vibration element 110 may be in the range of 0-10 g. For example, when it is required to flatten the frequency response curve of the acoustic output device at 200 Hz-900 Hz, the mass of the first vibration element 110 may be in a range of 0 g-0.5 g. As another example, when it is required to flatten the frequency response curve of the acoustic output device at 160 Hz-800 Hz, the mass of the first vibration element 110 may be in a range of 0.5 g-1 g. As another example, when it is required to flatten the frequency response curve of the acoustic output device at 150 Hz-700 Hz, the mass of the first vibration element 110 may be in a range of 1 g-2 g.

It can be seen from FIGS. 2-6 that a flat area of the frequency response curve of the acoustic output device 200 may be located between the first resonance peak and the second resonance peak, therefore, to flatten the frequency response curve of the acoustic output device 200 within a wider frequency range, a distance between the first resonance peak and the second resonance peak may be increased, that is, the first resonance frequency may be reduced and/or the second resonance frequency may be increased. It can be seen from the formula (2) that when the piezoelectric element 130 with a shorter length is selected, the second resonance frequency increases. However, the piezoelectric element 130 with a too short length may reduce the overall amplitude of the frequency response curve, thereby reducing the sensitivity of the acoustic output device 200. To solve the above problem, in some embodiments, the acoustic output device 200 may adopt a plurality of structures (also called single-beam structures) as shown in FIG. 2 (e.g., two structures arranged symmetrically shown in FIG. 7 or FIG. 17), which improves the sensitivity without affecting the overall output sound quality of the acoustic output device 200. In some embodiments, the symmetrical structure may further reduce unnecessary shaking and offset, and avoid adverse effects on the output sound quality of the acoustic output device 200. The symmetrical structure may include a structure in which a plurality of the piezoelectric elements 130 are center-symmetrical relative to the mass end (the first vibration element 110), and the plurality of piezoelectric elements 130 are center-symmetrical relative to the elastic mass end (the elastic element 140 and the second vibration element 120). For more descriptions of the centrosymmetric structure, please refer to FIG. 7, FIG. 8, FIG. 16, FIG. 17, and the related descriptions.

FIG. 7 is a schematic structural diagram illustrating an acoustic output device according to some embodiments of the present disclosure. In some embodiments, as shown in FIG. 7, an acoustic output device 700 may include the piezoelectric element 130, the first vibration element 110, the second vibration element 120, and the elastic element 140. In some embodiments, the piezoelectric element 130 may include a beam-like structure, and the first vibration element 110 is connected to a first position of the piezoelectric element 130. The second vibration element 120 may be connected to a second position of the piezoelectric element 130 through the elastic element 140. What needs to be known is that when the piezoelectric element 130 of the beam-like structure vibrates, an amplitude of the vibration at one end of the beam-like structure is relatively greater, so when the first position or the second position is located at the end of the beam-like structure, an output of a corresponding vibration element end has a higher response sensitivity and a better sound quality.

In some embodiments, as shown in FIG. 7, the first position may be located at the middle of a length extension direction of the beam-like structure (e.g., the first vibration element 110 may be attached to the middle of one surface of the piezoelectric element 130), the second position may be located at both ends of the length extension direction of the beam-like structure (e.g., the elastic element 140 may be attached to the two ends of the other surface of the piezoelectric element 130), thereby achieving a symmetrical structure with a plane passing through the first position of the piezoelectric element 130 and perpendicular to the length extension direction of the beam-like structure as a symmetrical plane. In this case, the piezoelectric element 130 may be regarded as including two piezoelectric sub-elements, and the first vibration element 110 and the second vibration element 120 may be regarded as including two vibration sub-elements, respectively. As shown in FIG. 7, the structure in dotted box C or C' is the same as the single-beam structure shown in FIG. 2, that is, one end of the piezoelectric element is connected to the vibration element, and the other end is connected to another vibration element through the elastic element. Therefore, the structure of the acoustic output device 700 as shown in FIG. 7 including two single-beam structures may be called a double-beam structure. In some embodiments, the piezoelectric element 130 may include two piezoelectric sub-elements. One end of each piezoelectric sub-element may be connected to one vibration sub-element. The other end of each piezoelectric sub-element may be connected to the second vibration element 120 through the elastic element 140. In this case, each piezoelectric sub-element may belong to a single-beam structure. In some embodiments, the piezoelectric elements of the two single-beam structures may be in a straight line. The two single-beam structures may be arranged symmetrically. In some embodiments, the acoustic output device 700 may include a four-beam structure. In other words, the acoustic output device 700 may include 4 single-beam structures. For example, the acoustic output device 700 may further include another piezoelectric element, which may be arranged in a "+" shape with the piezoelectric element 130. The other piezoelectric element may be connected to the second vibration element through elastic elements. It should be known that, in the present disclosure, a multi-beam structure may not necessarily include a corresponding count of piezoelectric elements 130, as long as the structure of the acoustic output device may be equivalent to the plurality of single-beam structures. For example, the double-beam structure shown in FIG. 7 may only include one piezoelectric element 130. As another example, the "+" shaped four-beam structure may only include two piezoelectric elements 130 arranged to cross each other.

Figure 8:
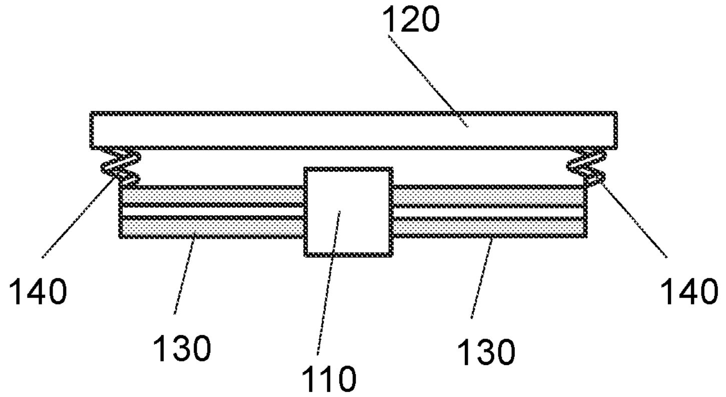
FIG. 8 is a schematic structural diagram illustrating an acoustic output device according to some embodiments of the present disclosure.

In some embodiments, the acoustic output device 700 may further include a connector 190, and the second vibration element 120 and the elastic element 140 may be connected to the second position of the piezoelectric element 130 through the connector 190. The connector 190 is disposed at the second position of the piezoelectric element 130, one end of the elastic element 140 is connected to the connector 190, and the other end of the elastic element 140 is connected to the second vibration element 120. The arrangement of the connector 190 enables the vibration at the second position of the piezoelectric element 130 to be transmitted to the elastic element 140 and the second vibration element 120, and also makes the structure of the elastic element 140 more flexible. For example, as shown in FIG. 7, the elastic element 140 may include a plurality of elastic rods. The elastic rods may be connected to the piezoelectric element 130 through the connector 190. In this case, in a vibration direction of the second vibration element 120, the elastic rods may have a longitudinal elasticity, and in a direction perpendicular to the vibration direction of the second vibration element 120, the elastic rods may have a transverse elasticity. As another example, as shown in FIG. 8, the elastic element 140 may be a spring. The second vibration element 120 may be a vibration plate. A length of the vibration plate may be longer than or equal to the length of the beam-like structure.

In some embodiments, the plurality of elastic rods may be axially symmetric distributed with respect to an axis passing through the center of the second vibration element 120. Exemplarily, as shown in FIG. 7, the acoustic output device 700 may include four elastic rods, and the four elastic rods are distributed on both sides of the second vibration element 120 in an "X" shape. In some embodiments, the second vibration element 120 may correspond to a middle position of the beam-like structure, so that the second vibration element 120 is not easy to shake in a non-vibration direction, thereby improving a flatness degree of the frequency response curve output by the elastic mass end of the acoustic output device 700.

FIG. 8 is a schematic structural diagram illustrating an acoustic output device according to some embodiments of the present disclosure. As shown in FIG. 8, an acoustic output device 800 may have a structure similar to the acoustic output device 700. For example, the acoustic output device 800 may include the piezoelectric element 130, the first vibration element 110, the second vibration element 120, and the elastic element 140. As another example, the piezoelectric element 130 may include a beam-like structure, and the first vibration element 110 is connected to the middle of the length extension direction of the beam-like structure. The second vibration element 120 may be connected to two ends of the length extension direction of the beam-like structure through the elastic elements 140.

In some embodiments, as shown in FIG. 8, the length of the second vibration element 120 may be longer than or equal to the length of the piezoelectric element 130 (or the beam-like structure). For example, the second vibration element 120 may be a vibration plate with the same shape as the piezoelectric element 130. The vibration plate and the piezoelectric element 130 may be arranged correspondingly. The elastic elements 140 may be springs or rods made of other materials with a small elastic coefficient. The elastic element 140 may be vertically disposed between the second vibration element 120 and the piezoelectric element 130.

In some embodiments, a count of the second vibration element 120 may be one or more. For example, the piezoelectric element 130 may be connected to the same second vibration element 120 through a plurality of elastic elements 140 (as shown in FIG. 8). As another example, each second position of the piezoelectric element 130 may correspond to one second vibration element 120, and the piezoelectric element 130 may be connected to the corresponding second vibration element 120 through one or more elastic elements 140.

Figure 9:
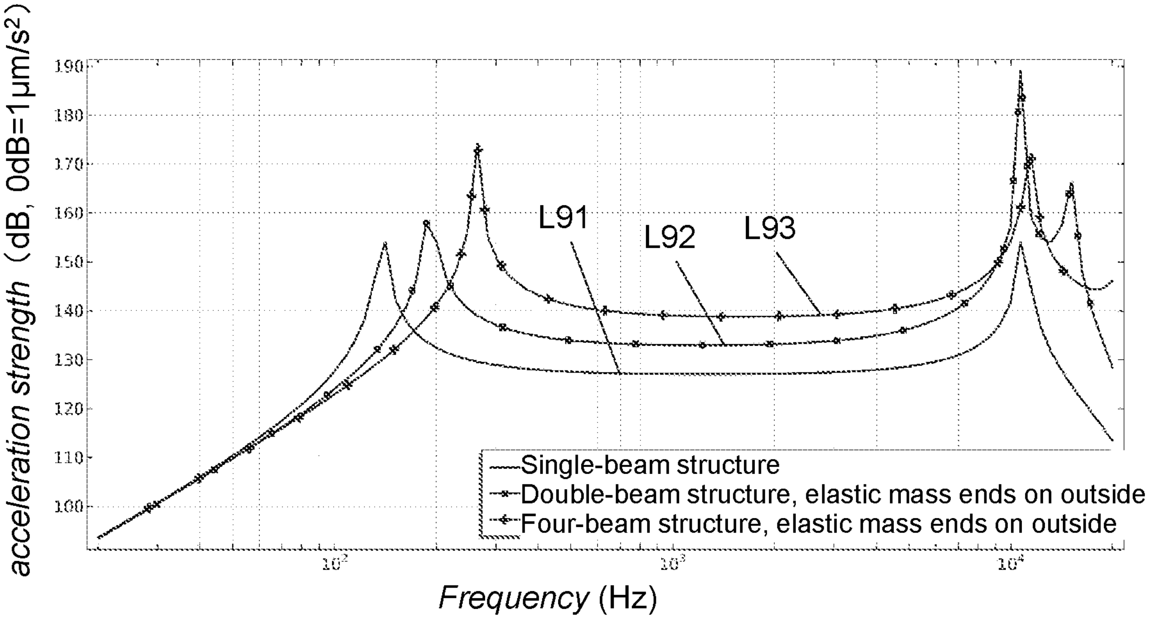
FIG. 9 illustrates frequency response curves of acoustic output devices with a single-beam structure, a double-beam structure, and a four-beam structure, respectively, when vibration signals are output from elastic mass ends according to some embodiments of the present disclosure.

FIG. 9 illustrates frequency response curves of acoustic output devices with a single-beam structure, a double-beam structure, and a four-beam structure, respectively, when vibration signals are output from elastic mass ends according to some embodiments of the present disclosure. As shown in FIG. 9, curve L91 represents a frequency response curve of an acoustic output device with a single-beam structure (e.g., the acoustic output device 200) when the vibration signal is output from the elastic mass end. Curve L92 represents a frequency response curve of an acoustic output device with a double-beam structure (e.g., the acoustic output device 700) when the vibration signal is output from the mass end. Curve L93 represents a frequency response curve of an acoustic output device with a four-beam structure when the vibration signal is output from the mass end. It can be seen from FIG. 9 that the output sensitivity of the acoustic output device with the double-beam structure (corresponding to curve L92) is higher than that of the acoustic output device with the single-beam structure (corresponding to curve L91). The sensitivity of a flat curve segment between the first resonance peak and the second resonance peak increases by about 6 dB. Compared with the acoustic output device with the single-beam structure (corresponding to curve L91), the sensitivity of the flat curve segment between the first and second resonance peaks of the acoustic output device with a four-beam structure (corresponding to curve L93) is increased by about 12 dB.

It can be seen from curves L91, L92, and L93 that with the increase of the single-beam structure in the acoustic output device, a frequency of the first resonance peak gradually moves to a high frequency. This is because the symmetrical distribution of multiple single-beam structures may introduce a plurality of elastic elements 140 to be connected in parallel, so that an overall elastic coefficient increases, thereby increasing the frequency of the first resonance peak.

It can be seen from the curve L41 in FIG. 4 that when the vibration is output by the elastic mass end of the acoustic output device 200, the curve between the first resonance peak and the second resonance peak is flat, but a count of high-frequency modes whose frequencies are greater than the frequency of the second resonance peak increases and the amplitude corresponding a frequency greater than the frequency of the second resonance peak drops. To solve this problem, in some embodiments, an additional second piezoelectric element 150 may be used to supplement the amplitude corresponding to the frequency greater than the frequency of the second resonance peak of the acoustic output device.

Figure 10:
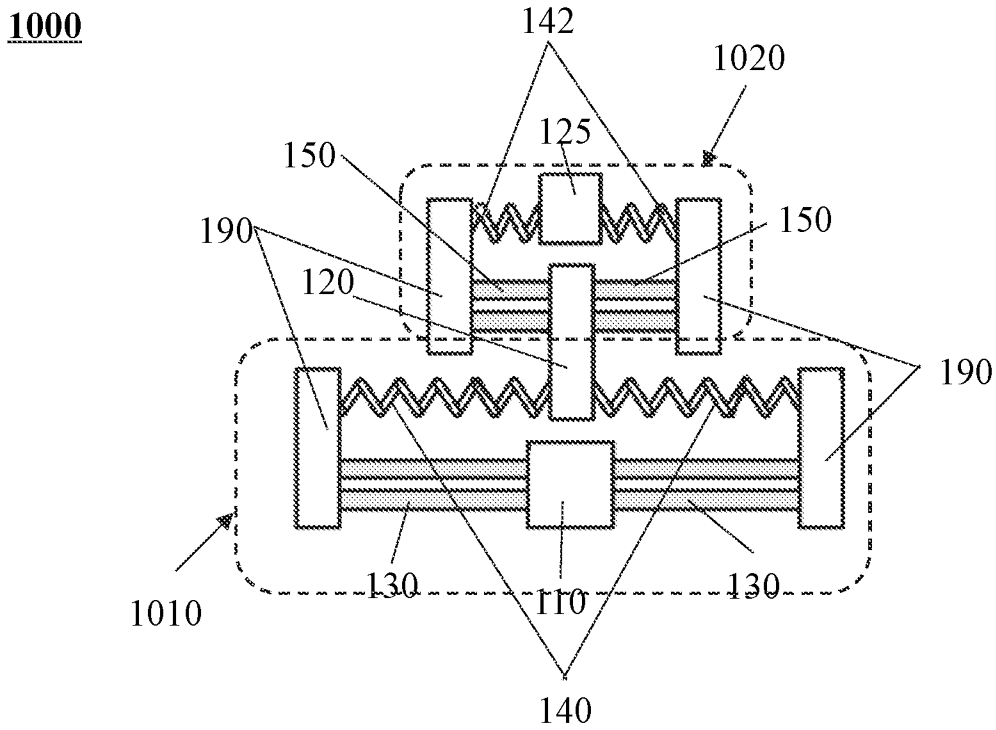
FIG. 10 is a schematic structural diagram illustrating an acoustic output device according to some embodiments of the present disclosure.

FIG. 10 is a schematic structural diagram illustrating an acoustic output device according to some embodiments of the present disclosure. As shown in FIG. 10, an acoustic output device 1000 may include the first vibration element 110, the second vibration element 120, the first piezoelectric element 130, the elastic element 140, and the connector 190. In some embodiments, the acoustic output device 1000 may further include a second piezoelectric element 150. Both the first piezoelectric element 130 and the second piezoelectric element 150 may include a beam-like structure. In some embodiments, the first vibration element 110 may be connected to the middle of the length extension direction of the first piezoelectric element 130. The second vibration element 120 may be connected to an end of the piezoelectric element 130 through the elastic element 140.

In some embodiments, the length of the beam-like structure of the second piezoelectric element 150 (also referred to as a second length) may be shorter than the length of the beam-like structure of the first piezoelectric element 130 (also referred to as a first length). In some embodiments, a ratio value of the second length to the first length is in a range of 0.1-1. In some embodiments, the ratio value of the second length to the first length is in a range of 0.2-0.8. In some embodiments, the ratio value of the second length to the first length is in a range of 0.3-0.7. In some embodiments, the ratio value of the second length to the first length is in a range of 0.4-0.6. In some embodiments, the ratio value of the second length to the first length may be 0.5. It can be seen from FIG. 5 that if the length of the piezoelectric element is shorter, the frequency response of the output of the piezoelectric element moves to a higher frequency. Therefore, the piezoelectric element with the longer beam-like structure may be called a low-frequency piezoelectric element, and the piezoelectric element with the shorter beam-like structure may be called a high-frequency piezoelectric element. In some embodiments, the entire structure of the acoustic output device 700 in FIG. 7 or the acoustic output device 800 in FIG. 8 may form a unit. In some embodiments, the acoustic output device 1000 may include a low-frequency unit 1010 including the low-frequency piezoelectric element and a second piezoelectric element 150.

The second piezoelectric element 150 may be connected to the second vibration element 120, so that the second vibration element 120 may receive the vibration of the second vibration element 150. For example, the second piezoelectric element 150 may be attached to the second vibration element 120. The resonance of the second piezoelectric element 150 may generate a third resonance peak with a frequency higher than the second resonance frequency of the low-frequency unit 1010. In some embodiments, the range of the third resonance frequency corresponding to the third resonance peak may be 10 kHz-40 kHz. In some embodiments, the range of the third resonance frequency corresponding to the third resonance peak may be 15 kHz-35 kHz. In some embodiments, the range of the third resonance frequency corresponding to the third resonance peak may be 20 kHz-30 kHz.

In some embodiments, as shown in FIG. 10, the acoustic output device 1000 may further include an elastic element(s) 142 and a vibration element 125. The vibration element 125 may be connected to the second piezoelectric element 150 through the elastic element(s) 142. The second vibration element 120, the vibration element 125, the second piezoelectric element 150, and the elastic element(s) 142 may constitute a high-frequency unit 1020 of the acoustic output device 1000. In other words, the acoustic output device 1000 may include the low-frequency unit 1010 and the high-frequency unit 1020. The high-frequency unit 1020 and the low-frequency unit 1010 may be connected through the second vibration element 120. That is to say, the elastic mass end of the low-frequency unit 1010 and the mass end of the high-frequency unit 1020 may share one vibration element (namely the second vibration element 120), so as to realize the connection between the high-frequency unit 1020 and the low-frequency unit 1010. In this case, the vibration of the acoustic output device 1000 may be output through the first vibration element 110 and/or the vibration element 125. The second length of the second piezoelectric element 150 in the high-frequency unit 1020 is shorter than the first length of the first piezoelectric element 130 in the low-frequency unit 1010. The resonance of the second piezoelectric element 150 and the second vibration element 120 may provide the above-mentioned third resonance peak for the acoustic output device 1000. In addition, the resonance of the elastic element(s) 142 and the vibration element 125 of the high-frequency unit 1020 may further provide the acoustic output device 1000 with a fifth resonance peak. The frequency response curve between the first one resonance peak (i.e., the fifth resonance peak) and the second one resonance peak (i.e., the third resonance peak) of the high-frequency unit 1020 is relatively flat. In some embodiments, a fifth resonance frequency corresponding to the fifth resonance peak may be greater or smaller than the second resonance frequency corresponding to the second resonance peak. In some embodiments, through adjusting a performance parameter (e.g. a material parameter or a geometric parameter of the piezoelectric element, a mass of the mass end or the elastic mass end) of the high-frequency unit 1020 and/or the low-frequency unit 1010, the fifth resonance frequency may be made to be close to the second resonance frequency, so that the frequency range in which the output frequency response of the high-frequency unit 1020 and the output frequency response of the low-frequency unit 1010 may interfere with each other may be reduced, and the sound quality of the acoustic output device 1000 may be improved. In some embodiments, a relationship between the second one resonance peak (i.e., the second resonance peak) of the low-frequency unit 1010 and the first one resonance peak (i.e., the fifth resonance peak) of the high-frequency unit 1020 may satisfy the following formula:

$$0 \leq \frac{|f_1 - f_0'|}{f_1} \leq 4, \tag{7}$$

where $f_1$ indicates the frequency of the second one resonance peak of the low-frequency unit 1010 (i.e., the second resonance frequency); $f'_0$ indicates the frequency of the first one resonance peak of the high-frequency unit 1020 (i.e., the fifth resonance frequency). In some embodiments, when the second resonance frequency is between 8 kHz-10 kHz, the fifth resonance frequency may be between 5 kHz-40 kHz. In some embodiments, when the second resonance frequency is between 5 kHz-8 kHz, the fifth resonance frequency may be between 4 kHz-25 kHz. In some embodiments, when the second resonance frequency is between 2 kHz-5 kHz, the fifth resonance frequency may be between 100 Hz-10 kHz. In some embodiments, when the second resonance frequency is between 1 kHz-3 kHz, the fifth resonance frequency may be between 100 Hz-5 kHz.

It should be noted that a count of the first piezoelectric elements 130 of the low-frequency unit 1010 and a count of the second piezoelectric elements 150 of the high-frequency unit 1020 of the acoustic output device 1000 may be one or more, and the count of the first piezoelectric elements 130 and the count of the second piezoelectric elements 150 may be the same or different. Exemplarily, the acoustic output device 1000 may only include one piezoelectric element 130 and one second piezoelectric element 150, at this time, the vibration element 125 may be connected to both ends of the second piezoelectric element 150 through the elastic element(s) 142, and the second vibration element 120 may be connected to both ends of the first piezoelectric element 130 through the elastic element(s) 140. As another example, the acoustic output device 1000 may also include two first piezoelectric elements 130 and one second piezoelectric element 150, at this time, the vibration element 125 may be connected to both ends of the second piezoelectric element 150 through the elastic element(s) 142, the second vibration element 120 may be respectively connected to one end of each first piezoelectric element 130 through the elastic element(s) 140. The other end of each first piezoelectric element 130 may be connected to the first vibration element 110.

Figure 11:
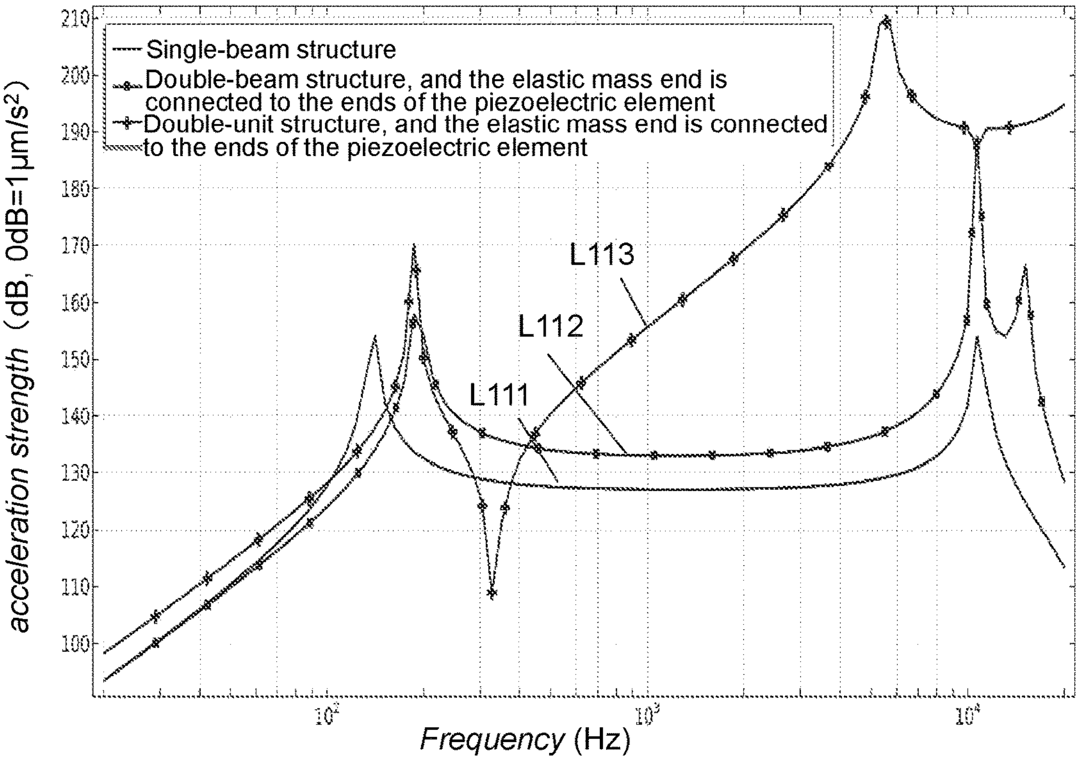
FIG. 11 illustrates frequency response curves of exemplary acoustic output devices according to some embodiments of the present disclosure.
Figure 12:
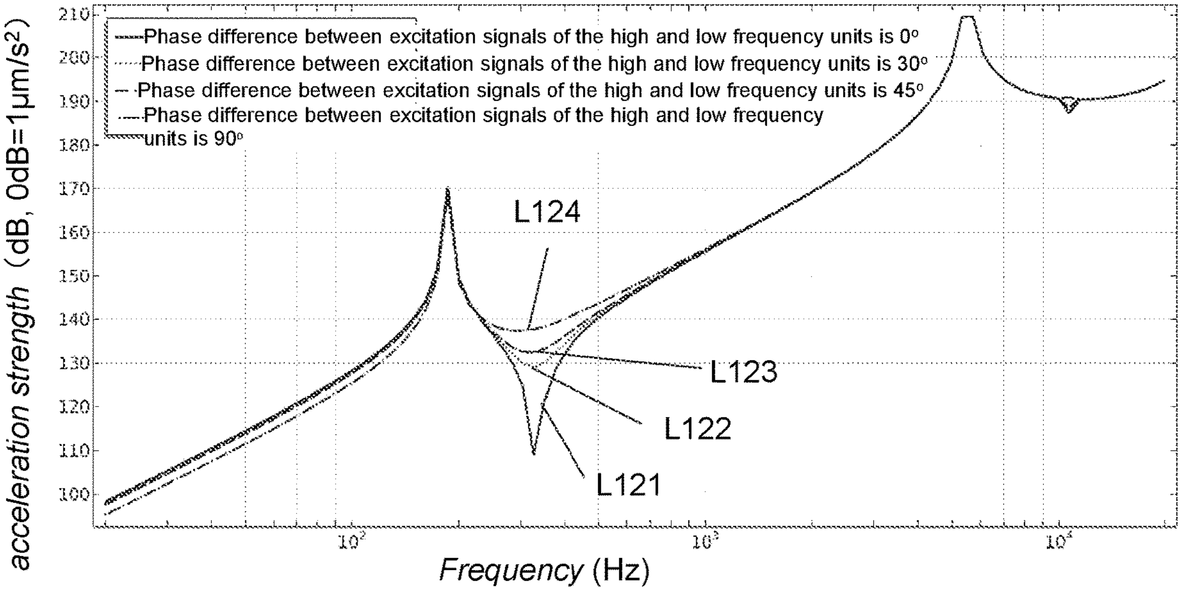
FIG. 12 illustrates frequency response curves of an acoustic output device corresponding to different excitation signal phase differences.
Figure 13:
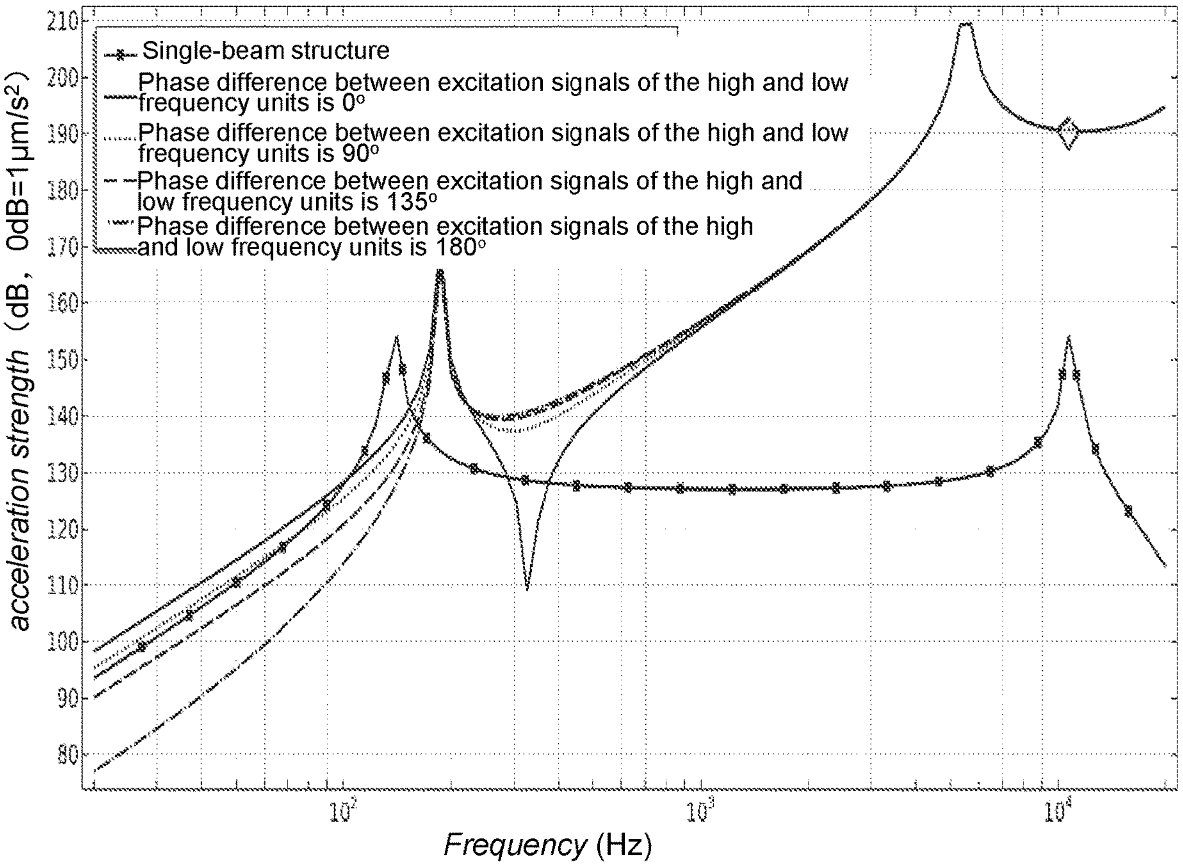
FIG. 13 illustrates frequency response curves of an acoustic output device corresponding to different excitation signal phase differences.

FIG. 11 illustrates frequency response curves of exemplary acoustic output devices according to some embodiments of the present disclosure. FIG. 12 illustrates frequency response curves of an acoustic output device corresponding to different excitation signal phase differences. FIG. 13 illustrates frequency response curves of an acoustic output device corresponding to different excitation signal phase differences. As shown in FIG. 11, curve L111 represents a frequency response curve of an acoustic output device with a single-beam structure when a vibration signal is output from an elastic mass end. Curve L112 represents a frequency response curve of an acoustic output device with a double-beam structure when the vibration signal is output from an elastic mass end. Curve L113 represents a frequency response curve of an acoustic output device with a double-unit structure (i.e., a high-frequency unit and a low-frequency unit) when the vibration signal is output from an elastic mass end. The acoustic output device with the double-unit structure may have the structure of the acoustic output device 1000 as shown in FIG. 10, and a phase difference between an excitation signal (e.g., an excitation voltage) of the high-frequency unit 1020 and an excitation signal of the low-frequency unit 1010 is 0°. It can be seen from FIG. 11 that the acoustic output device 1000 generates a resonance valley after the first resonance peak, which is caused by the resonance of the second vibration element 120 in thereof. In some embodiments, the resonance valley may be filled by adjusting phases of the excitation signals of the second piezoelectric element 150 of the high-frequency unit 1020 and the first piezoelectric element 130 of the low-frequency unit 1010. As shown in FIG. 12, as the phase difference between the excitation signals of the high and low-frequency units increases (corresponding to curves L121-124), an amplitude of the resonance valley gradually increases. In some embodiments, an absolute value of the phase difference between the excitation signals of the high-frequency unit and the low-frequency unit (i.e., the phase difference between the second piezoelectric element 150 and the piezoelectric element 130) ranges from 45° to 180°. It should be noted that, as shown in FIG. 13, when the absolute value of the phase difference between the second piezoelectric element 150 and the first piezoelectric element 130 is greater than 135°, the amplitude in a low-frequency range before the first resonance peak decreases. Therefore, in order to ensure a value of the amplitude in a low-frequency range of the acoustic output device 1000, the absolute value of the phase difference between the second piezoelectric element 150 and the piezoelectric element 130 may range from 45° to 135°. In some embodiments, the absolute value of the phase difference between the second piezoelectric element 150 and the piezoelectric element 130 may range from 45° to 125°. In some embodiments, the absolute value of the phase difference between the second piezoelectric element 150 and the piezoelectric element 130 may range from 50° to 110°. In some embodiments, the absolute value of the phase difference between the second piezoelectric element 150 and the piezoelectric element 130 may range from 60° to 100°. In some embodiments, the absolute value of the phase difference between the second piezoelectric element 150 and the piezoelectric element 130 may range from 70° to 90°. In some embodiments, the range of the absolute value of the phase difference between the second piezoelectric element 150 and the piezoelectric element 130 may be 80°.

Figure 14:
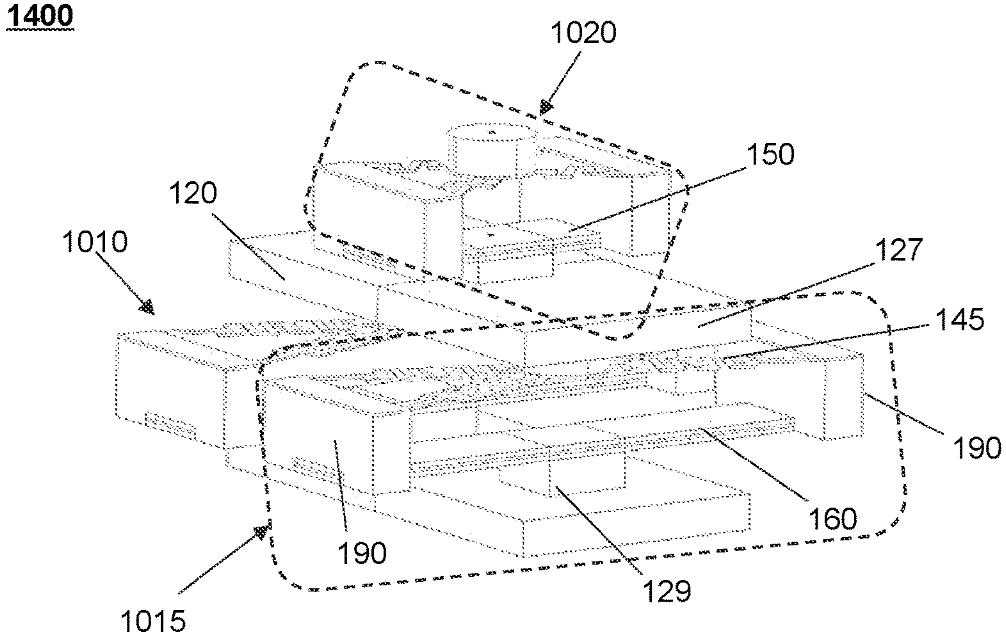
FIG. 14 is a schematic structural diagram illustrating an exemplary acoustic output device according to some embodiments of the present disclosure.

FIG. 14 is a schematic structural diagram illustrating an exemplary acoustic output device according to some embodiments of the present disclosure. As shown in FIG. 14, in order to further improve a low-frequency response of the acoustic output device, based on the structure of the acoustic output device 1000, an acoustic output device 1400 may further include a third piezoelectric element 160. The third piezoelectric element 160 may vibrate in response to a driving voltage, and transmit the vibration to the second piezoelectric element 150. In some embodiments, each of the first piezoelectric element 130, the second piezoelectric element 150, and the third piezoelectric element 160 may include a beam-like structure. A length of the beam-like structure of the third piezoelectric element 160 (also referred to as a third length) may be longer than the length of the beam-like structure of the second piezoelectric element 150 (i.e., a second length). In some embodiments, a third length of the third piezoelectric element 160 may be between the second length of the second piezoelectric element 150 and the first length of the first piezoelectric element 130. In some embodiments, the third length of the third piezoelectric element 160 may be equal to the first length of the first piezoelectric element 130. In some embodiments, the third length of the third piezoelectric element 160 is smaller than the second length of the second piezoelectric element 150, and the third piezoelectric element 160 may resonate to generate a fourth resonance peak whose frequency is lower than the third resonance peak.

Figure 15:
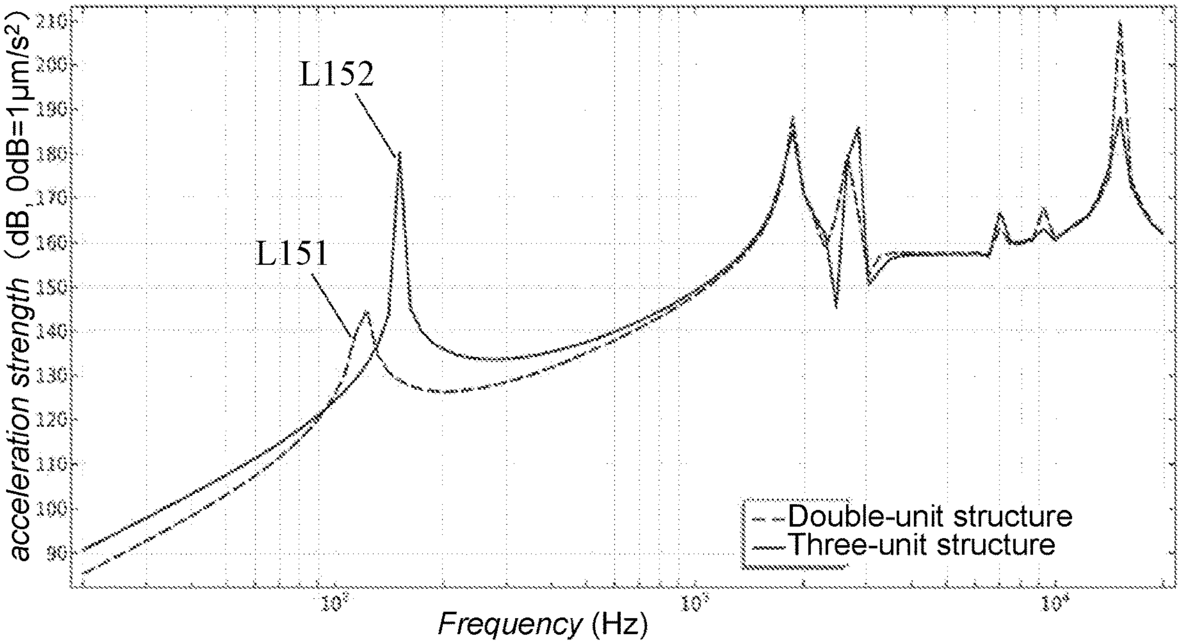
FIG. 15 illustrates frequency response curves of acoustic output devices with different structures according to some embodiments of the present disclosure.

In some embodiments, the acoustic output device 1400 may further include a third vibration element 127. The third vibration element 127 may be connected to the second piezoelectric element 150 and may be at least connected to the third piezoelectric element 160 through the second elastic element(s) 145. Accordingly, the vibration of the third piezoelectric element 160 may be transmitted to the second piezoelectric element 150 through the third vibration element 127. In some embodiments, the acoustic output device 1400 may further include a vibration element 129. The vibration element 129 may be located at the middle of a length extension direction of the third piezoelectric element 160. The third vibration element 127, the vibration element 129, the third piezoelectric element 160, and the second elastic element 145 may form a second low-frequency unit 1015 similar in structure to the low-frequency unit 1010 (also called a first low-frequency unit). In other words, the acoustic output device 1400 may include the low-frequency unit 1010, a second low-frequency unit 1015, and the high-frequency unit 1020. In some embodiments, the low-frequency unit 1010 and the second low-frequency unit 1015 may be connected in parallel, so as to improve the low-frequency response of the acoustic output device 1400 (as shown in FIG. 15). In some embodiments, the acoustic output device 1400 includes the low-frequency unit 1010, the second low-frequency unit 1015, and the high-frequency unit 1020, which may further be referred that the acoustic output device 1400 includes a three-unit structure.

Specifically, as shown in FIG. 14, the first piezoelectric element 130 and the third piezoelectric element 160 may be arranged in parallel. An elastic mass end of the low-frequency unit 1010 (i.e., the second vibration element 120) may be connected to an elastic mass end of the second low-frequency unit 1015 (i.e., the third vibration element 127). The second piezoelectric element 150 may be directly connected to the connected second vibration element 120 and/or the third vibration element 127. A whole of the connected second vibration element 120 and the third vibration element 127 may serve as the mass end of the high-frequency unit 1020. In some embodiments, the mass end of the low-frequency unit 1010 (i.e., the first vibration element 110) and the mass end of the second low-frequency unit 1015 (i.e., the vibration element 129) may be connected (as shown in FIG. 14), or may be separated, wherein the separated structure may enable the mass end of the low-frequency unit 1010 and the mass end of the second low-frequency unit 1015 to vibrate separately, the connected structure may make the frequency responses output by the vibration of the mass end of the low-frequency unit 1010 and the mass end of the second low-frequency unit 1015 consistent. In some embodiments, the mass end of the low-frequency unit 1010 may be connected to the mass end of the second low-frequency unit 1015.

In some embodiments, the structures of the low-frequency unit 1010, the low-frequency unit 1015 and the high-frequency unit 1020 may be the same or different. For example, both the low-frequency unit 1010 and the low-frequency unit 1015 may have the structure like the acoustic output device 800, and the high-frequency unit 1020 may have the structure like the acoustic output device 700. As another example, the low-frequency unit 1010, the low-frequency unit 1015 and the high-frequency unit 1020 may all have the structure like the acoustic output device 800.

In some embodiments, the acoustic output device 1400 may not include the third vibration element 127. The vibration of the third piezoelectric element 160 of the low-frequency unit 1015 may be transmitted to the second vibration element 120 through the second elastic element(s) 145, and then transmitted to the second piezoelectric element 150 by the second vibration element 120. In other words, as shown in FIG. 14, the second vibration element 120 and the third vibration element 127 may be regarded as a whole, the vibration of the piezoelectric element 130 of the low-frequency unit 1010 and the vibration of the third piezoelectric element 160 of the low-frequency unit 1015 are both transmitted to the same second vibration element, thereby reducing a count of vibration elements and saving resources.

FIG. 15 illustrates frequency response curves of acoustic output devices with different structures according to some embodiments of the present disclosure. As shown in FIG. 15, curve L151 represents a frequency response curve of an acoustic output device (e.g., the acoustic output device 1000) with a double-unit structure (i.e., a high-frequency unit and a low-frequency unit) when a vibration signal is outputted from an elastic mass end. Curve L152 represents a frequency response curve of an acoustic output device 1400 including the low-frequency unit 1010, the second low-frequency unit 1015, and the high-frequency unit 1020 when a vibration signal is outputted from a mass end. It can be seen from FIG. 15 that the low-frequency response (corresponding to 20 Hz-500 Hz in the curve L152) of the acoustic output device 1400 is significantly higher than that of the acoustic output device 1000 with a double-unit structure.

FIG. 16 is a schematic structural diagram illustrating an exemplary acoustic output device according to some embodiments of the present disclosure. As shown in FIG. 16, the acoustic output device 1600 may include the first vibration element 110, the second vibration element 120, the piezoelectric element 130, and the elastic element 140. The piezoelectric element 130 may include a beam-like structure, and the first vibration element 110 may include vibration sub-elements 112 and 114. In some embodiments, the vibration sub-elements 112 and 114 may be respectively connected to two ends (also referred to as a first position) of a length extension direction of the piezoelectric element 130. The second vibration element 120 may be connected to a second position of the piezoelectric element 130 through the elastic element 140. For example, the second vibration element 120 may be disposed at the middle (i.e., the second position) of the length extension direction of the piezoelectric element 130 through the connector 190 and the elastic element 140. In some embodiments, the piezoelectric element 130 may include two piezoelectric sub-elements. One end of each piezoelectric sub-element may be respectively connected to one vibration sub-element (112 or 114). The other end of each piezoelectric sub-element may be connected by the connector 190. In this case, the structure of the acoustic output device 1600 may be regarded as including two single-beam structures as shown in FIG. 2.

In some embodiments, masses of the vibration sub-elements 112 and 114 may be the same, and the two first positions where the vibration sub-elements 112 and 114 are connected to the piezoelectric element 130 are symmetrical about the center of the piezoelectric element 130, so that the vibration sub-elements 112 and 114 are symmetrical about the center of piezoelectric element 130. The symmetrical structure balances each other to reduce an unnecessary shaking of the vibration sub-element 112 and improve the flatness of the frequency response curve of the acoustic output device 1600.

In some embodiments, a count of piezoelectric elements 130 may be one or more. Correspondingly, a count of the first vibration elements 110 directly connected to the piezoelectric element 130 may be more than one. For example, the count of the piezoelectric elements 130 may be two. The two piezoelectric elements 130 may be cross-connected in a "+" shape through the connector(s). Further, the ends of each piezoelectric element 130 may be arranged with the first vibration element 110. The second vibration element 120 may be connected at a cross point of the "+" shape through the elastic element 140. As another example, the count of the piezoelectric elements 130 may be four, and one end of each of the four piezoelectric elements 130 may be connected through the connector 190, so that the four piezoelectric elements 130 are arranged in a "+" shape around the connector 190, and each piezoelectric element 130 may be connected with one first vibration element 110. In some embodiments, the plurality of piezoelectric elements 130 may also correspond to one first vibration element 110. Exemplarily, the four piezoelectric elements 130 are centered on the connector 190 and arranged in the "+" shape around the connector 190, and each piezoelectric element 130 may be connected to an annular first vibration element 110.

In some embodiments, as shown in FIG. 16, the elastic element 140 may include a plurality of elastic rods. The elastic rods may be connected to the piezoelectric element 130 through the connector 190. In this case, the elastic rods may have a first elastic coefficient in the vibration direction of the second vibration element 120, and may further have a second elastic coefficient in a direction perpendicular to the vibration direction of the second vibration element 120. In some embodiments, in order to make the second vibration element 120 vibrate easily in a direction perpendicular to the surface of the piezoelectric element 130 and not easily shake in a direction parallel to a long axis of the piezoelectric element 130, the second elastic coefficient may be much greater than the first elastic coefficient. For example, a ratio value of the second elastic coefficient to the first elastic coefficient may be greater than or equal to $1\times10^3$. For example, the ratio value of the second elastic coefficient to the first elastic coefficient may be $1\times10^3$, $1\times10^4$, $1\times10^5$, $1\times10^6$, $1\times10^{10}$ and so on. In some embodiments, the elastic element 140 may be a vibration transmission sheet.

FIG. 17 is a schematic structural diagram illustrating an exemplary acoustic output device according to some embodiments of the present disclosure. As shown in FIG. 17, an acoustic output device 1700 may have a structure similar to that of the acoustic output device 1600. In some embodiments, as shown in FIG. 17, the elastic element 140 may further be a spring or a rod made of other materials with a small elastic coefficient. The elastic element 140 may be vertically disposed between the second vibration member 120 and the piezoelectric member 130.

Figure 18:
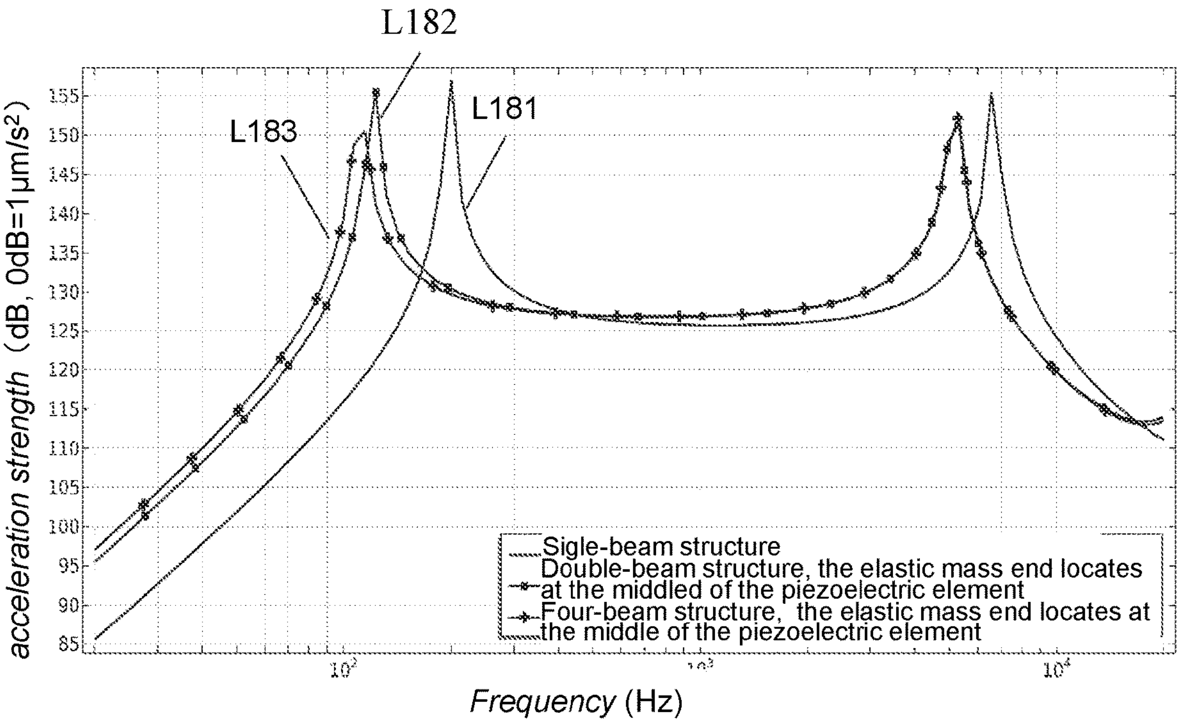
FIG. 18 illustrates frequency response curves of acoustic output devices with a single-beam structure, a double-beam structure, and a four-beam structure, respectively, when vibration signals are output from elastic mass ends according to some embodiments of the present disclosure.

FIG. 18 illustrates frequency response curves of acoustic output devices with a single-beam structure, a double-beam structure, and a four-beam structure, respectively, when vibration signals are output from elastic mass ends according to some embodiments of the present disclosure. As shown in FIG. 18, curve L181 represents a frequency response curve of an acoustic output device with a single-beam structure (e.g., the acoustic output device 200) when the vibration signal is output from the elastic mass end. Curve L182 represents a frequency response curve of an acoustic output device (e.g., the acoustic output device 1600) with a double-beam structure and the elastic mass end is located in the middle of a length extension direction when the vibration signal is output from an elastic mass end. Curve L183 represents a frequency response curve of an acoustic output device with a four-beam structure and the elastic mass end is located in the middle of the length extension direction of the piezoelectric element when the vibration signal is output from an elastic mass end. It can be seen from FIG. 18 that compared with the single-beam structure (corresponding to curve L181), the first resonance peak of the acoustic output device using the multi-beam structure (corresponding to curve L182 or L183) shifts to low-frequency, so the use of multi-beam structure can significantly improve the low-frequency response performance of the acoustic output device.

The basic concept has been described above, obviously, for those skilled in the art, the above-detailed disclosure is only an example and does not constitute a limitation to the present disclosure. Although not expressly stated here, various modifications, improvements, and amendments to the present disclosure may be made by those skilled in the art. Such modifications, improvements, and amendments are suggested in the present disclosure, so they still belong to the spirit and scope of the embodiments of the present disclosure.

Meanwhile, the present disclosure uses specific words to describe the embodiments of the present disclosure. For example, "one embodiment," "an embodiment," and/or "some embodiments" refer to a certain feature, structure, or characteristic related to at least one embodiment of the present disclosure. Therefore, it should be emphasized and noted that references to "an embodiment," or "one embodiment," or "an alternative embodiment" two or more times in different places in this present disclosure do not necessarily refer to the same embodiment. In addition, certain features, structures, or characteristics of one or more embodiments of the present disclosure may be properly combined.

In addition, those skilled in the art can understand that various aspects of the present disclosure can be illustrated and described through several patentable categories or situations, including any new and useful processes, machines, products, or combinations of materials, or any new and useful improvements. In addition, those skilled in the art can understand that various aspects of the present disclosure can be illustrated and described through several patentable categories or situations, including any new and useful processes, machines, products, or combinations of materials, or any new and useful improvements. The above hardware or software may be referred to as "block," "module," "engine," "unit," "component" or "system." Additionally, aspects of the present disclosure may be embodied as a computer product comprising computer-readable program code on one or more computer-readable media.

The computer storage medium may include a propagation data signal containing a computer program encoding, such as on a baseband or as part of a carrier. The propagation signal may have various manifestations, including electromagnetic form, optical form, etc., or a suitable combination. The computer storage medium may be any computer-readable medium other than the computer-readable storage medium, which can be used to perform systems, devices, or devices to implement communication, propagating, or devices by connecting to an instruction. Program encoding on a computer storage medium can be propagated by any suitable medium, including radio, cables, fiber optic cables, RF, or similar media, or any of the above media.

In addition, unless the claims are clearly stated, the order of the processing elements and sequences, the use of digital letters, or the use of other names described in the present disclosure are not used to limit the order and method of the present disclosure process and method. While the foregoing disclosure has discussed by way of various examples some embodiments of the invention that are presently believed to be useful, it should be understood that such detail is for illustrative purposes only and that the appended claims are not limited to the disclosed embodiments, but rather, the claims are intended to cover all modifications and equivalent combinations that fall within the spirit and scope of the embodiments of the present disclosure. For example, although the system components described above may be implemented by hardware devices, they may also be implemented by a software-only solution, such as installing the described system on an existing server or mobile device.

In the same way, it should be noted that in order to simplify the expression disclosed in the present disclosure and help the understanding of one or more embodiments of the present disclosure, in the foregoing description of the embodiments of the present disclosure, sometimes multiple features are combined into one embodiment, drawings or descriptions thereof. This method of disclosure does not, however, imply that the subject matter of the present disclosure requires more features than are recited in the claims. Indeed, embodiment features are less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." Unless otherwise stated, the "about," "approximately" or "substantially" indicates that the stated figure allows for a variation of ±20%. Accordingly, in some embodiments, the numerical parameters used in the present disclosure and claims are approximations that can vary depending on the desired characteristics of individual embodiments. In some embodiments, numerical parameters should consider the specified significant digits and adopt the general digit reservation method. Although the numerical ranges and parameters used in some embodiments of the present disclosure to confirm the breadth of the scope are approximate values, in specific embodiments, such numerical values are set as precisely as practicable.

Finally, it should be understood that the embodiments described in the present disclosure are only used to illustrate the principles of the embodiments of the present disclosure. Other modifications are also possible within the scope of the present disclosure. Therefore, by way of example and not limitation, alternative configurations of the embodiments of the present disclosure may be considered consistent with the teachings of the present disclosure. Accordingly, the embodiments of the present disclosure are not limited to the embodiments explicitly introduced and described in the present disclosure.

What is claimed is:

1. An acoustic output device, comprising:

a first vibration element;

a second vibration element; and a piezoelectric element, the first vibration element being physically connected to a first position of the piezoelectric element, and the second vibration element being connected to a second position of the piezoelectric element at least through an elastic element, wherein the piezoelectric element drives the first vibration element and the second vibration element to vibrate in response to an electrical signal, and the vibration produces two resonance peaks within an audible range of human ears;

a second piezoelectric element, the second piezoelectric element receiving vibration of the second vibration element, wherein the second piezoelectric element resonates to generate a third resonance peak whose frequency is higher than a frequency of any one of the two resonance peaks.

2. The acoustic output device of claim 1, wherein the resonance of the second vibration element and the elastic element produces a first resonance peak with a lower frequency among the two resonance peaks, and the resonance of the piezoelectric element and the first vibration element produces a second resonance peak with a higher frequency among the two resonance peaks.

3. The acoustic output device of claim 2, wherein the frequency of the first resonance peak is in a range of 50 Hz-2000 Hz, and the frequency of the second resonance peak is in a range of 1 kHz-10 kHz.

4. The acoustic output device of claim 1, further comprising:

a connection element, the second vibration element and the elastic element are connected to the second position of the piezoelectric element through the connection element.

5. The acoustic output device of claim 1, wherein the piezoelectric element comprises a beam-like structure, and the first position is located at the middle of a length extension direction of the beam-like structure.

6. The acoustic output device of claim 5, wherein the second position is located at an end of the length extension direction of the beam-like structure.

7. The acoustic output device of claim 6, the elastic element includes a plurality of elastic rods, the plurality of elastic rods are axially symmetric distributed with respect to an axis passing through a center of the second vibration element.

8. The acoustic output device of claim 5, wherein the vibration is transmitted to a user through the second vibration element in a bone conduction manner.

9. The acoustic output device of claim 1, wherein the frequency of the third resonance peak is in a range of 10 kHz-40 kHz.

10. The acoustic output device of claim 1, further comprising:

a fourth vibration element, the fourth vibration element being connected to a third position of the second piezoelectric element through at least a third elastic element, wherein the third elastic element and the fourth vibration element resonate to generate a fifth resonance peak whose frequency is lower than the frequency of the third resonance peak, wherein a ratio value of an absolute value of a difference between the frequencies corresponding to the second resonance peak and the fifth resonance peak to the frequency corresponding to the second resonance peak is in a range of 0-4.

11. The acoustic output device of claim 1, wherein both the piezoelectric element and the second piezoelectric element include a beam-like structure, and a length of the beam-like structure of the second piezoelectric element is shorter than a length of the beam-like structure of the piezoelectric element.

12. The acoustic output device of claim 11, wherein a ratio value of the length of the beam-like structure of the second piezoelectric element to the length of the beam-like structure of the piezoelectric element is in a range of 0.1-1.

13. The acoustic output device of claim 1, wherein an absolute value of a phase difference between excitation signals of the piezoelectric element and the second piezoelectric element is in a range of 45°-135°.

14. The acoustic output device of claim 1, further comprising:

a third piezoelectric element, wherein the third piezoelectric element vibrates and transmits the vibration to the second piezoelectric element, and the third piezoelectric element resonates to generate a fourth resonance peak whose frequency is lower than the frequency of the third resonance peak.

15. The acoustic output device of claim 14, further comprising:

a third vibration element, wherein the third vibration element is connected with the third piezoelectric element at least through a second elastic element, and the vibration of the third piezoelectric element is transmitted to the second piezoelectric element through the third vibration element.

16. The acoustic output device of claim 1, wherein the piezoelectric element comprises a beam-like structure, and the first vibration element comprises two vibration sub-elements, wherein, the two vibration sub-elements are respectively connected to two ends of a length extension direction of the piezoelectric element.

17. The acoustic output device of claim 16, wherein the two vibration sub-elements have the same mass, and the two first positions where the two vibration sub-elements are connected to the piezoelectric element are symmetrical with respect to a center of the piezoelectric element.

18. The acoustic output device of claim 1, wherein a length of the piezoelectric element is in a range of 3 mm-30 mm.

19. The acoustic output device of claim 1, wherein the piezoelectric element comprises two piezoelectric sheets and a substrate, and the two piezoelectric sheets are attached to opposite sides of the substrate respectively, the substrate vibrates in response to an extension and contraction of the two piezoelectric sheets along a length extension direction.

* * * * *